US012633891B2

(12) United States Patent
Daimon et al.

(10) Patent No.: US 12,633,891 B2
(45) Date of Patent: May 19, 2026

(54) ACOUSTIC WAVE DEVICE

(71) Applicant: Murata Manufacturing Co., Ltd.,
Nagaokakyo (JP)

(72) Inventors: Katsuya Daimon, Nagaokakyo (JP);
Hideki Iwamoto, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 871 days.

(21) Appl. No.: 17/960,855

(22) Filed: Oct. 6, 2022

(65) Prior Publication Data

US 2023/0114497 A1       Apr. 13, 2023

Related U.S. Application Data

(63) Continuation      of      application      No.
PCT/JP2021/015222, filed on Apr. 12, 2021.

(30) Foreign Application Priority Data

Apr. 17, 2020      (JP) ................................. 2020-074254

(51) Int. Cl.
H03H 9/02       (2006.01)
H03H 9/145      (2006.01)
(Continued)

(52) U.S. Cl.
CPC .......... H03H 9/02 (2013.01); H03H 9/02574
(2013.01); H03H 9/14541 (2013.01);
(Continued)

(58) Field of Classification Search
CPC .. H03H 9/02; H03H 9/02574; H03H 9/14541;
H03H 9/25; H03H 9/02559; H03H
9/02566; H10N 30/85
See application file for complete search history.

(56) References Cited

U.S. PATENT DOCUMENTS 7,353,687 B2 *   4/2008   Tang ...................... G01M 3/007
                                                    73/1.16
7,757,371 B2 *   7/2010   Liu ........................... C23F 4/00
                                                    73/1.25

(Continued)

FOREIGN PATENT DOCUMENTS

CN        113454912 A   *   9/2021   ......... H03H 9/02574
CN        110620562 B   *   4/2023   ......... H03H 9/02559
(Continued)

OTHER PUBLICATIONS

IP.com search history. (Year: 2025).*

(Continued)

*Primary Examiner* — Pedro J Cuevas
(74) *Attorney, Agent, or Firm* — Keating & Bennett, LLP

(57)       ABSTRACT

An acoustic wave device includes a silicon substrate, a first
high-acoustic-velocity film on the silicon substrate, a first
low-acoustic-velocity film on the first high-acoustic-velocity
film, a second low-acoustic-velocity film on the first low-
acoustic-velocity film, a second high-acoustic-velocity film
on the second low-acoustic-velocity film, a piezoelectric
film on the second high-acoustic-velocity film, and an IDT
electrode on the piezoelectric film. Acoustic velocities of
bulk waves propagating through the first and second high-
acoustic-velocity films are higher than an acoustic velocity
of an acoustic wave propagating through the piezoelectric
film. Acoustic velocities of bulk waves propagating through
the first and second low-acoustic-velocity films are lower
than an acoustic velocity of a bulk wave propagating
through the piezoelectric film. Materials of the first and
second low-acoustic-velocity films are different from each
other.

20 Claims, 9 Drawing Sheets

(51) Int. Cl.
  *H03H 9/25*      (2006.01)
  *H03H 9/64*      (2006.01)
  *H10N 30/01*     (2023.01)
  *H10N 30/85*     (2023.01)
(52) U.S. Cl.
  CPC ............ H03H 9/25 (2013.01); H03H 9/6483
       (2013.01); H10N 30/01 (2023.02); H10N
                              30/85 (2023.02)

(56)              References Cited

U.S. PATENT DOCUMENTS

| | | | | |
|---|---|---|---|---|
| 10,148,248 | B2 * | 12/2018 | Takamine | H03H 9/02566 |
| 10,361,663 | B2 * | 7/2019 | Ariumi | H03F 3/193 |
| 10,862,455 | B2 * | 12/2020 | Takai | H03H 9/02559 |
| 10,886,896 | B2 * | 1/2021 | Yamane | H03F 3/195 |
| 11,146,237 | B2 * | 10/2021 | Nagatomo | H03H 9/02086 |
| 11,190,162 | B2 * | 11/2021 | Iwamoto | H03H 9/02559 |
| 11,456,719 | B2 * | 9/2022 | Iwamoto | H03H 9/02086 |
| 11,463,068 | B2 * | 10/2022 | Iwamoto | H03H 9/02834 |
| 11,496,226 | B2 * | 11/2022 | Nakagawa | H03H 9/0222 |
| 11,509,282 | B2 * | 11/2022 | Nagatomo | H03H 9/174 |
| 11,509,284 | B2 * | 11/2022 | Iwamoto | H03H 9/02559 |
| 11,552,616 | B2 * | 1/2023 | Nakagawa | H03H 9/02614 |
| 11,611,324 | B2 * | 3/2023 | Iwamoto | H03H 9/0222 |
| 11,677,378 | B2 * | 6/2023 | Sakai | H03H 9/02866 |
| | | | | 310/313 C |
| 12,088,273 | B2 * | 9/2024 | Iwamoto | H03H 9/02559 |
| 12,113,509 | B2 * | 10/2024 | Nagatomo | H03H 9/02559 |
| 12,149,223 | B2 * | 11/2024 | Taniguchi | H03H 9/02228 |
| 12,149,226 | B2 * | 11/2024 | Taniguchi | H03H 9/02866 |
| 12,224,733 | B2 * | 2/2025 | Daimon | H03H 9/02637 |
| 12,289,088 | B2 * | 4/2025 | Liu | H03H 9/02566 |
| 12,289,096 | B2 * | 4/2025 | Takeuchi | H03H 9/568 |
| 12,395,151 | B2 * | 8/2025 | Michigami | H03H 9/02992 |
| 2006/0143895 | A1 * | 7/2006 | Liu | C04B 35/6224 |
| | | | | 29/527.1 |
| 2006/0144120 | A1 * | 7/2006 | Tang | G01M 3/007 |
| | | | | 73/1.16 |
| 2008/0211602 | A1 * | 9/2008 | Khelif | H03H 9/175 |
| | | | | 29/25.35 |
| 2009/0045704 | A1 * | 2/2009 | Barber | H03H 9/131 |
| | | | | 29/25.35 |
| 2013/0285768 | A1 | 10/2013 | Watanabe et al. | |
| 2014/0130319 | A1 * | 5/2014 | Iwamoto | H03H 9/059 |
| | | | | 29/25.35 |
| 2014/0139075 | A1 * | 5/2014 | Iwamoto | H10N 30/877 |
| | | | | 29/25.35 |
| 2014/0152146 | A1 * | 6/2014 | Kimura | H10N 30/8542 |
| | | | | 29/25.35 |
| 2015/0102705 | A1 * | 4/2015 | Iwamoto | H03H 9/171 |
| | | | | 310/313 B |
| 2017/0093371 | A1 * | 3/2017 | Takamine | H03H 9/02574 |
| 2018/0102745 | A1 * | 4/2018 | Ariumi | H03F 3/601 |

| | | | | |
|---|---|---|---|---|
| 2018/0102761 | A1 * | 4/2018 | Takai | H03H 9/14544 |
| 2018/0159497 | A1 | 6/2018 | Iwamoto et al. | |
| 2019/0097602 | A1 * | 3/2019 | Kimura | H03H 9/02228 |
| 2019/0165758 | A1 * | 5/2019 | Sakai | H03H 9/02866 |
| 2019/0363697 | A1 * | 11/2019 | Yamane | H03H 9/706 |
| 2019/0372547 | A1 * | 12/2019 | Kishimoto | H03H 3/02 |
| 2019/0386639 | A1 * | 12/2019 | Iwamoto | H01P 1/20336 |
| 2019/0393854 | A1 | 12/2019 | Koyanagi et al. | |
| 2019/0393856 | A1 * | 12/2019 | Iwamoto | H03H 9/02921 |
| 2019/0393858 | A1 * | 12/2019 | Iwamoto | H03H 9/145 |
| 2020/0177153 | A1 * | 6/2020 | Nakagawa | H03H 9/02559 |
| 2020/0204150 | A1 * | 6/2020 | Iwamoto | H03H 9/02228 |
| 2020/0228092 | A1 * | 7/2020 | Nagatomo | H03H 9/589 |
| 2020/0295730 | A1 * | 9/2020 | Nagatomo | H03H 9/14541 |
| 2020/0328823 | A1 * | 10/2020 | Nakagawa | H04B 11/00 |
| 2020/0389147 | A1 * | 12/2020 | Iwamoto | H03H 9/02866 |
| 2021/0399712 | A1 * | 12/2021 | Daimon | H03H 9/25 |
| 2022/0014175 | A1 * | 1/2022 | Nagatomo | H03H 9/14541 |
| 2022/0029600 | A1 * | 1/2022 | Daimon | H03H 9/02984 |
| 2022/0123711 | A1 * | 4/2022 | Taniguchi | H03H 9/02574 |
| 2022/0158623 | A1 * | 5/2022 | Takeuchi | H03H 9/6483 |
| 2022/0216850 | A1 * | 7/2022 | Taniguchi | H03H 9/02866 |
| 2022/0224311 | A1 * | 7/2022 | Daimon | H03H 9/173 |
| 2023/0037955 | A1 * | 2/2023 | Daimon | H03H 9/02881 |
| 2023/0039830 | A1 * | 2/2023 | Daimon | H03H 9/25 |
| 2023/0084908 | A1 * | 3/2023 | Michigami | H03H 9/02818 |
| | | | | 333/193 |
| 2023/0261638 | A1 * | 8/2023 | Daimon | H03H 9/02559 |
| | | | | 310/313 R |
| 2023/0308079 | A1 * | 9/2023 | Daimon | H03H 9/02559 |
| 2023/0336154 | A1 * | 10/2023 | Ito | H03H 9/132 |
| 2023/0344404 | A1 * | 10/2023 | Daimon | H03H 9/25 |
| 2023/0344405 | A1 * | 10/2023 | Daimon | H03H 9/02637 |
| 2023/0353124 | A1 * | 11/2023 | Nakamura | H03H 9/25 |
| 2023/0361756 | A1 * | 11/2023 | Nakamura | H03H 9/02574 |
| 2025/0175145 | A1 * | 5/2025 | Nakamura | H03H 9/02992 |

FOREIGN PATENT DOCUMENTS

| | | | | | |
|---|---|---|---|---|---|
| CN | 113454912 | B | * | 2/2024 | H03H 9/02574 |
| JP | 7264229 | B2 | * | 4/2023 | H03H 9/174 |
| KR | 20200060318 | A | * | 5/2020 | H03H 9/178 |
| WO | 2012086639 | A1 | | 6/2012 | |
| WO | WO-2012086441 | A1 | * | 6/2012 | H03H 9/02574 |
| WO | 2017043427 | A1 | | 3/2017 | |
| WO | 2018154950 | A1 | | 8/2018 | |
| WO | 2018164209 | A1 | | 9/2018 | |

OTHER PUBLICATIONS

Ip.com search results. (Year: 2025).*
International Search Report in PCT/JP2021/015222, mailed May 25, 2021, 3 pages.
Written Opinion in PCT/JP2021/015222, mailed May 25, 2021, 4 pages.

* cited by examiner (110) PLANE

ACOUSTIC WAVE DEVICE

CROSS REFERENCE TO RELATED APPLICATIONS

This application claims the benefit of priority to Japanese Patent Application No. 2020-074254 filed on Apr. 17, 2020 and is a Continuation Application of PCT Application No. PCT/JP2021/015222 filed on Apr. 12, 2021. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices have been widely used in filters of mobile phones and the like. International Publication No. 2012/086639 discloses an example of an acoustic wave device. In this acoustic wave device, a support substrate, a high-acoustic-velocity film, a low-acoustic-velocity film, and a piezoelectric film are laminated in this order. An InterDigital Transducer (IDT) electrode is provided on the piezoelectric film. The fact that the acoustic wave device has the above-described multilayer structure increases its Q value. Silicon is disclosed as an example of a material of the support substrate.

However, in an acoustic wave device such as that described in International Publication No. 2012/086639, there is a possibility that a spurious response of a higher-order mode will occur.

SUMMARY OF THE INVENTION

Preferred embodiments of the present invention provide acoustic wave devices that are each able to reduce or prevent unwanted waves of a higher-order mode and the like over a wide band.

An acoustic wave device according to a preferred embodiment of the present invention includes a silicon substrate, a first high-acoustic-velocity film on the silicon substrate, a first low-acoustic-velocity film on the first high-acoustic-velocity film, a second low-acoustic-velocity film on the first low-acoustic-velocity film, a second high-acoustic-velocity film on the second low-acoustic-velocity film, a piezoelectric film on the second high-acoustic-velocity film, and an IDT electrode on the piezoelectric film, an acoustic velocity of a bulk wave propagating through the first high-acoustic-velocity film and an acoustic velocity of a bulk wave propagating through the second high-acoustic-velocity film are higher than an acoustic velocity of a bulk wave propagating through the piezoelectric film, an acoustic velocity of a bulk wave propagating through the first low-acoustic-velocity film and an acoustic velocity of a bulk wave propagating through the second low-acoustic-velocity film are lower than an acoustic velocity of a bulk wave propagating through the piezoelectric film, and a material of the first low-acoustic-velocity film and a material of the second low-acoustic-velocity film are different from each other.

The acoustic wave devices according to preferred embodiments of the present invention are each able to reduce or prevent unwanted waves of a higher-order mode and the like over a wide band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Each preferred embodiment described in the present specification is illustrative, and partial replacement or combination of configurations can be made between different preferred embodiments.

Figure 1:
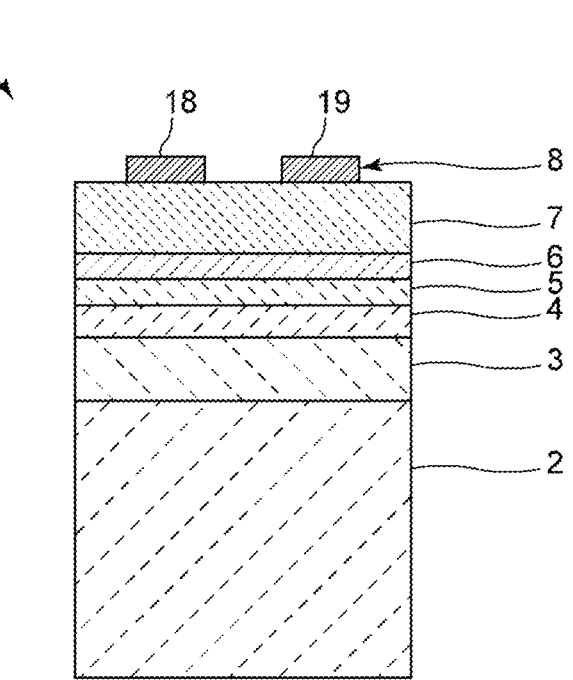
FIG. 1 is a front cross-sectional view illustrating a portion of an acoustic wave device according to a first preferred embodiment of the present invention.
Figure 2:
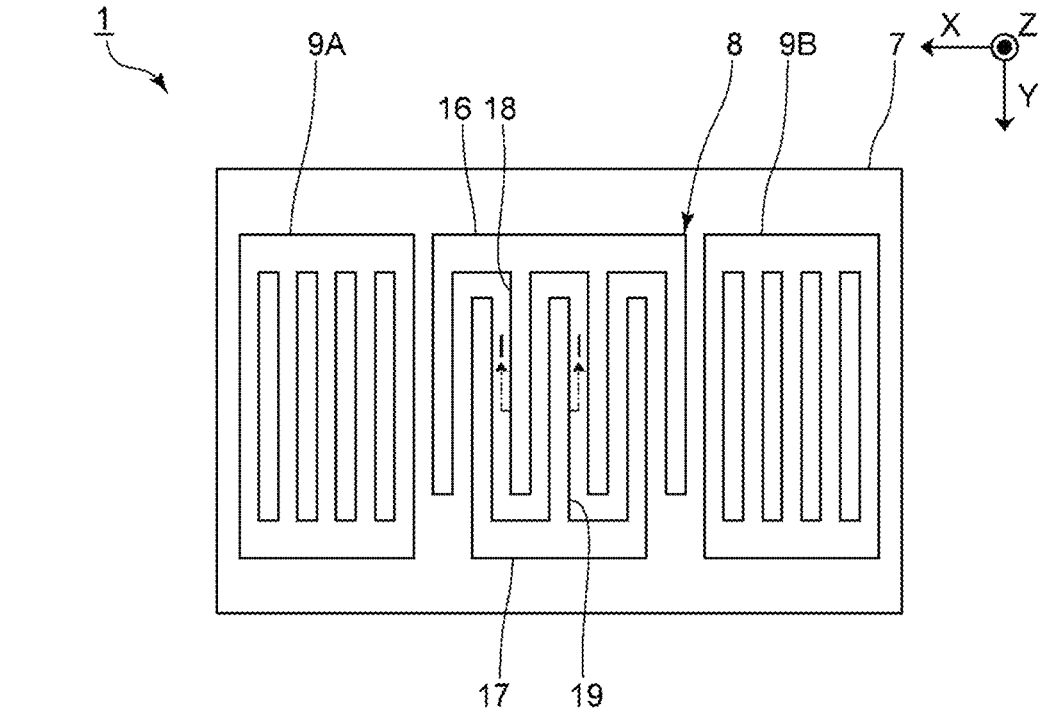
FIG. 2 is a plan view of the acoustic wave device according to the first preferred embodiment of the present invention.

FIG. 1 is a front cross-sectional view illustrating a portion of an acoustic wave device according to a first preferred embodiment of the present invention. FIG. 2 is a plan view of an acoustic wave device according to the first preferred embodiment. Note that FIG. 1 is a cross-sectional view taken along a line I-I in FIG. 2.

As illustrated in FIG. 1, an acoustic wave device 1 includes a silicon substrate 2, a first high-acoustic-velocity film 3, a first low-acoustic-velocity film 4, a second low-acoustic-velocity film 5, a second high-acoustic-velocity film 6, and a piezoelectric film 7. More specifically, the first high-acoustic-velocity film 3 is provided on the silicon substrate 2. The first low-acoustic-velocity film 4 is provided on the first high-acoustic-velocity film 3. The second low-acoustic-velocity film 5 is provided on the first low-acoustic-velocity film 4. The second high-acoustic-velocity film 6 is provided on the second low-acoustic-velocity film 5. The piezoelectric film 7 is provided on the second high-acoustic-velocity film 6.

An IDT electrode 8 is provided on the piezoelectric film 7. By applying an AC voltage to the IDT electrode 8, an acoustic wave is excited. As illustrated in FIG. 2, a pair of reflectors 9A and 9B are provided at both sides of the IDT electrode 8 in an acoustic wave propagation direction on the piezoelectric film 7. The acoustic wave device 1 is, for example, a surface acoustic wave resonator. However, acoustic wave devices according to preferred embodiments of the present invention are not limited to acoustic wave resonators, and may be a filter device or a multiplexer including, for example, the acoustic wave resonator.

As illustrated in FIG. 2, the IDT electrode 8 includes a first busbar 16, a second busbar 17, a plurality of first electrode fingers 18, and a plurality of second electrode fingers 19. The first busbar 16 and the second busbar 17 face each other. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other. In the present specification, the acoustic wave propagation direction is defined as an X direction. A direction in which the first electrode fingers 18 and the second electrode fingers 19 of the IDT electrode 8 extend is defined as a Y direction. A thickness direction of the IDT electrode 8, the piezoelectric film 7, the silicon substrate 2, and the like is defined as a Z direction.

The IDT electrode 8, the reflector 9A, and the reflector 9B are defined a multilayer metal film. More specifically, in the multilayer metal film, a Ti layer, an Al layer, and a Ti layer are laminated in this order. However, materials of the IDT electrode 8, the reflector 9A, and the reflector 9B are not limited to that described above. Alternatively, for example, the IDT electrode 8, the reflector 9A, and the reflector 9B may be defined by a single-layer metal film.

Referring back to FIG. 1, the piezoelectric film 7 is, for example, a lithium tantalate film. To be more specific, the piezoelectric film 7 is, for example, a 40° Y-cut X-propagation LiTaO$_3$ film. A material and a cut angle of the piezoelectric film 7 are not limited to those described above. As the material of the piezoelectric film 7, for example, lithium niobate may be used. As the lithium niobate, for example, LiNbO$_3$ can be used. In a case where the piezoelectric film 7 is a LiTaO$_3$ film, Euler angles of the piezoelectric film 7 are represented by (LTφ, LTθ, LTψ). The piezoelectric film 7 has crystal axes (X$_P$, Y$_P$, Z$_P$).

The first high-acoustic-velocity film 3 and the second high-acoustic-velocity film 6 that are illustrated in FIG. 1 are films having a relatively high acoustic velocity. More specifically, an acoustic velocity of a bulk wave propagating through the first high-acoustic-velocity film 3 is higher than an acoustic velocity of an acoustic wave propagating through the piezoelectric film 7. Similarly, an acoustic velocity of a bulk wave propagating through the second high-acoustic-velocity film 6 is higher than the acoustic velocity of the acoustic wave propagating through the piezoelectric film 7. In the present preferred embodiment, both the first high-acoustic-velocity film 3 and the second high-acoustic-velocity film 6 are, for example, silicon nitride films. More specifically, both the first high-acoustic-velocity film 3 and the second high-acoustic-velocity film 6 are, for example, SiN films. The materials of the first high-acoustic-velocity film 3 and the second high-acoustic-velocity film 6 are not limited to those described above, and for example, a medium including a material such as hafnium oxide, tungsten oxide, or niobium pentoxide as a main component may be used.

In the present preferred embodiment, the first high-acoustic-velocity film 3 and the second high-acoustic-velocity film 6 are made of the same material. However, the material of the first high-acoustic-velocity film 3 may be different from the material of the second high-acoustic-velocity film 6.

The first low-acoustic-velocity film 4 and the second low-acoustic-velocity film 5 have a relatively low acoustic velocity. More specifically, an acoustic velocity of a bulk wave propagating through the first low-acoustic-velocity film 4 is lower than the acoustic velocity of the bulk wave propagating through the piezoelectric film 7. Similarly, an acoustic velocity of a bulk wave propagating through the second low-acoustic-velocity film 5 is lower than the acoustic velocity of the bulk wave propagating through the piezoelectric film 7. The first low-acoustic-velocity film 4 according to the present preferred embodiment is, for example, a silicon oxide film. Silicon oxide is represented by SiO$_a$. a is a freely-selected positive number. In the present preferred embodiment, silicon oxide of the first low-acoustic-velocity film 4 is, for example, SiO$_2$. On the other hand, the second low-acoustic-velocity film 5 is, for example, a tantalum pentoxide film. To be more specific, the second low-acoustic-velocity film 5 is, for example, a Ta$_2$O$_5$ film. Thus, the material of the first low-acoustic-velocity film 4 is different from the material of the second low-acoustic-velocity film 5. The materials of the first low-acoustic-velocity film 4 and the second low-acoustic-velocity film 5 are not limited to those described above, and, for example, a material including glass, silicon oxynitride, lithium oxide, tantalum pentoxide, silicon oxide, or a compound obtained by adding fluorine, carbon, or boron to silicon oxide as a main component can be used.

It is only required that the material of the first low-acoustic-velocity film 4 is different from the material of the second low-acoustic-velocity film 5. However, the first low-acoustic-velocity film 4 or the second low-acoustic-velocity film 5 is preferably, for example, a SiO$_2$ film. In this case, the absolute value of a temperature coefficient of frequency (TCF) of the acoustic wave device 1 can be reduced, and a frequency-temperature characteristic can be improved.

A feature of the present preferred embodiment is that the silicon substrate 2, the first high-acoustic-velocity film 3, the first low-acoustic-velocity film 4, the second low-acoustic-velocity film 5, the second high-acoustic-velocity film 6, and the piezoelectric film 7 are laminated in this order, and the material of the first low-acoustic-velocity film 4 and the material of the second low-acoustic-velocity film 5 are different from each other. This makes it possible to reduce or prevent unwanted waves of a higher-order mode and the like over a wide band. Details of this advantageous effect will be described below together with definitions of the crystal axes and the plane orientations.

Figure 3:
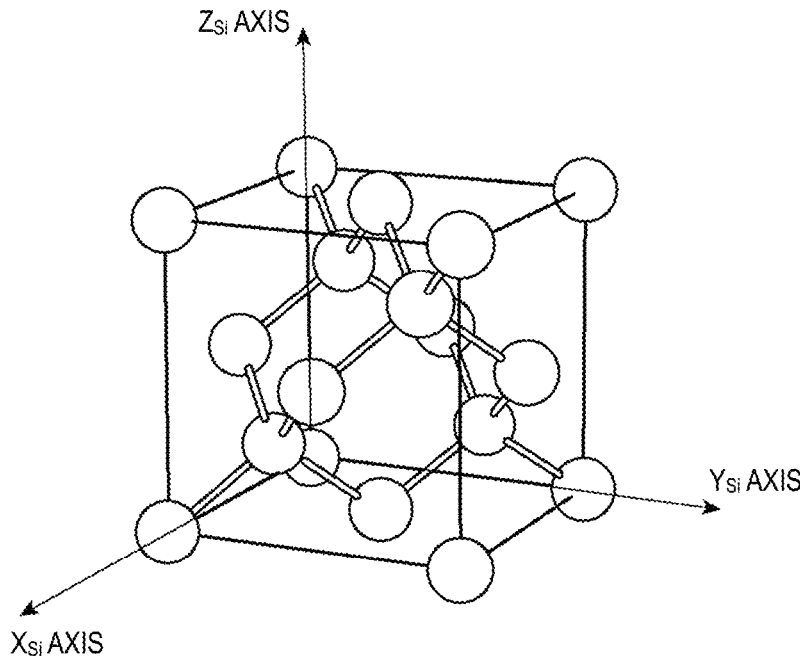
FIG. 3 is a schematic view illustrating the definition of crystal axes of silicon.
Figure 4:
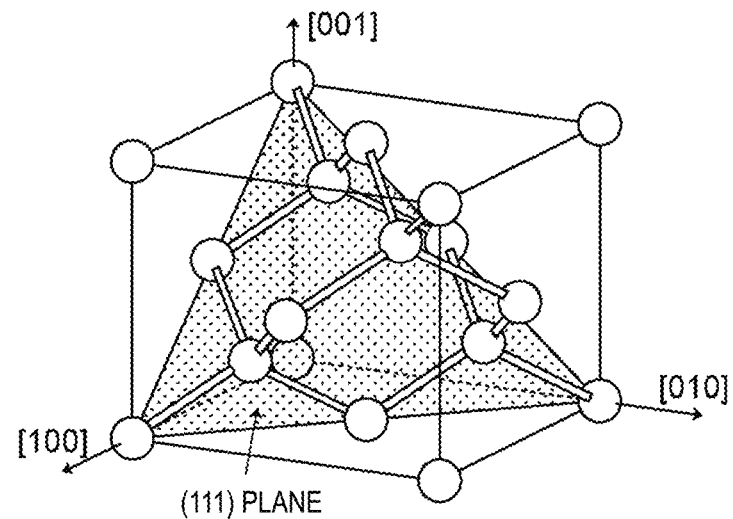
FIG. 4 is a schematic view illustrating a (111) plane of silicon.
Figure 5:
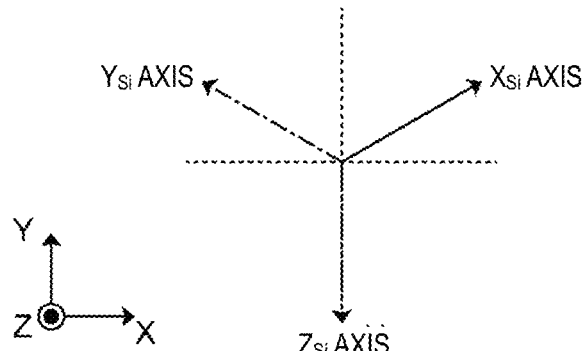
FIG. 5 is a diagram of the crystal axes of the (111) plane of silicon in a view from an XY plane.
Figure 6:
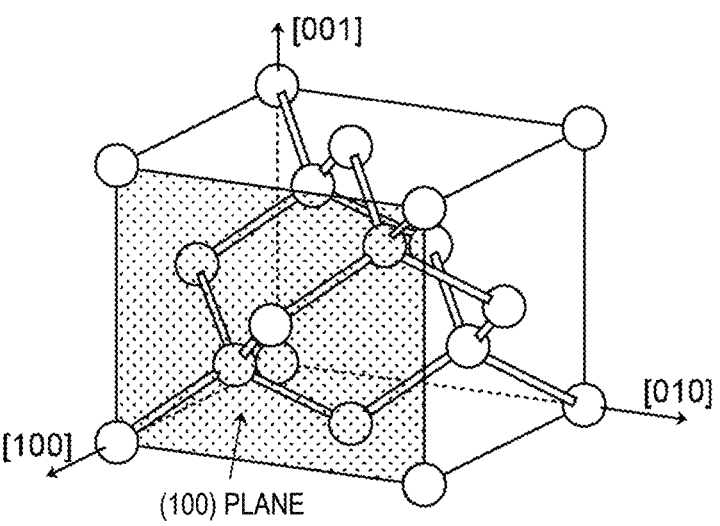
FIG. 6 is a schematic view illustrating a (100) plane of silicon.
Figure 7:
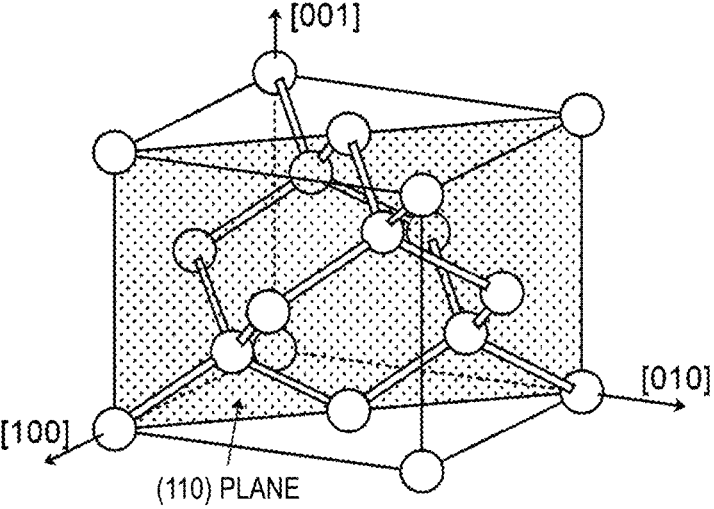
FIG. 7 is a schematic view illustrating a (110) plane of silicon.

FIG. 3 is a schematic view illustrating the definition of crystal axes of silicon. FIG. 4 is a schematic view illustrating a (111) plane of silicon. FIG. 5 is a diagram of the crystal axes of the (111) plane of silicon in a view from an XY plane. FIG. 6 is a schematic view illustrating a (100) plane of silicon. FIG. 7 is a schematic view illustrating a (110) plane of silicon.

The silicon substrate 2 described above is a silicon single crystal substrate. As illustrated in FIG. 3, silicon has a diamond structure. In the present specification, the crystal axes of silicon defining the silicon substrate are represented by $[X_{Si}, Y_{Si}, Z_{Si}]$. In silicon, the $X_{Si}$ axis, the $Y_{Si}$ axis, and the $Z_{Si}$ axis are equivalent due to the symmetry of the crystal structure. As illustrated in FIG. 5, the (111) plane has in-plane threefold symmetry, and an equivalent crystal structure is obtained by 120° rotation.

A plane orientation of the silicon substrate 2 in the present preferred embodiment is (111). The plane orientation of (111) means that the substrate is cut by the (111) plane that is orthogonal or substantially orthogonal to crystal axes and that is represented by a Miller index [111] in the crystal structure of silicon having a diamond structure. The (111) plane is a plane illustrated in FIG. 4 and FIG. 5. However, other crystallographically equivalent planes are also included.

The plane orientation of the silicon substrate 2 is not limited to the above, and may be (100) or (110), for example. The plane orientation of (100) means that the substrate is cut by the (100) plane that is orthogonal or substantially orthogonal to crystal axes and that is represented by a Miller index [100] in the crystal structure of silicon having a diamond structure. The (100) plane has in-plane fourfold symmetry, and an equivalent crystal structure is obtained by 90° rotation. Note that the (100) plane is the plane illustrated in FIG. 6.

On the other hand, the plane orientation of (110) means that the substrate is cut by the (110) plane that is orthogonal or substantially orthogonal to the crystal axes and that is represented by the Miller index [110] in the crystal structure of silicon having a diamond structure. The (110) plane has in-plane twofold symmetry, and an equivalent crystal structure is obtained by 180° rotation. The (110) plane is the plane illustrated in FIG. 7.

In the following, an angle $\alpha$ and a direction vector k, which will be described later, will be described in detail. The angle $\alpha$ is any one of three types of angles $\alpha_{111}$, $\alpha_{110}$, and $\alpha_{100}$. The direction vector k is any one of $k_{111}$, $k_{110}$, and $k_{100}$.

Figure 8:
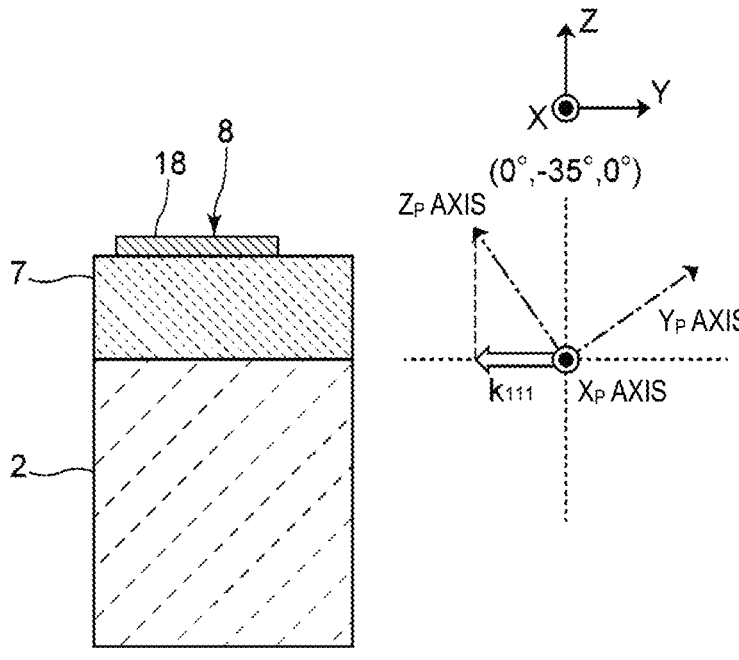
FIG. 8 is a schematic cross-sectional view for explaining a direction vector $k_{111}$.
Figure 9:
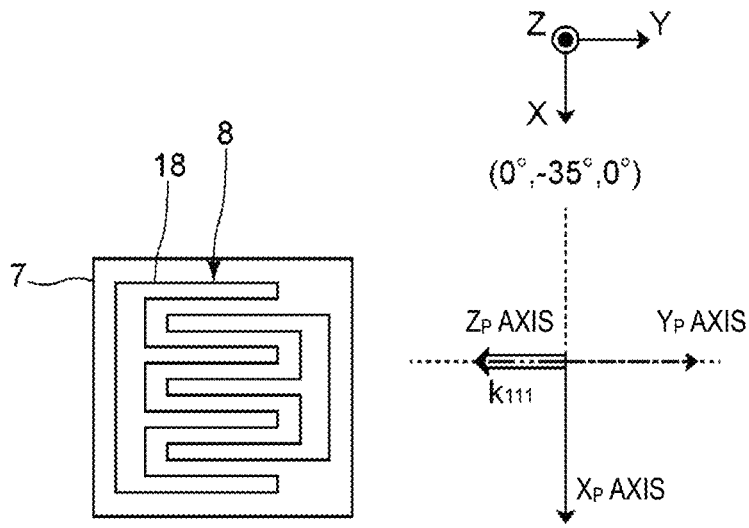
FIG. 9 is a schematic plan view for explaining the direction vector $k_{111}$.

FIG. 8 is a schematic cross-sectional view for explaining the direction vector $k_{111}$. FIG. 9 is a schematic plan view for explaining the direction vector $k_{111}$. Note that the plane orientation of the silicon substrate 2 in FIG. 8 is (111).

FIG. 8 and FIG. 9 illustrate an example in which the Euler angles of the piezoelectric film 7 are (about 0°, about −35°, about 0°). In this example, the IDT electrode 8 is provided on the positive surface of the piezoelectric film 7. The (111) plane of the silicon substrate 2 is in contact with the piezoelectric film 7.

Here, as illustrated in FIG. 8, a direction vector obtained by projecting a $Z_P$ axis of a piezoelectric material of LiTaO$_3$ defining the piezoelectric film 7 onto the (111) plane of the silicon substrate 2 is defined as $k_{11}$. As illustrated in FIG. 8 and FIG. 9, the direction vector $k_{111}$ is parallel or substantially parallel to a Y direction in which the electrode fingers of the IDT electrode 8 extend.

Figure 10:
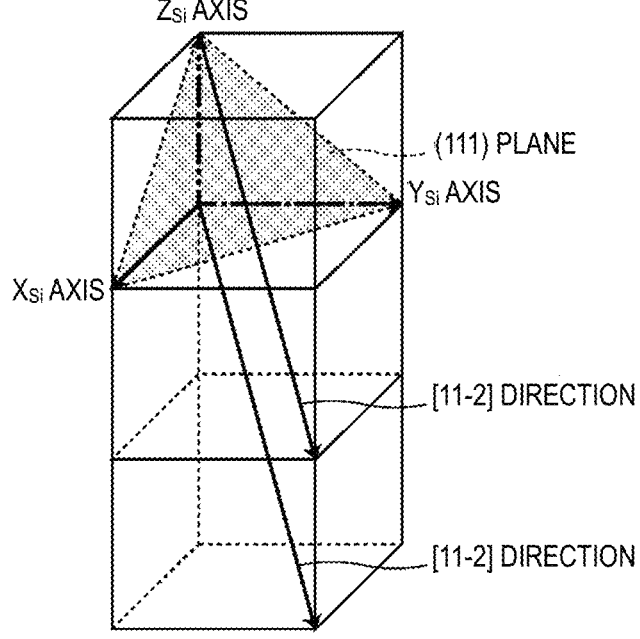
FIG. 10 is a schematic view illustrating a [11-2] direction of silicon.
Figure 11:
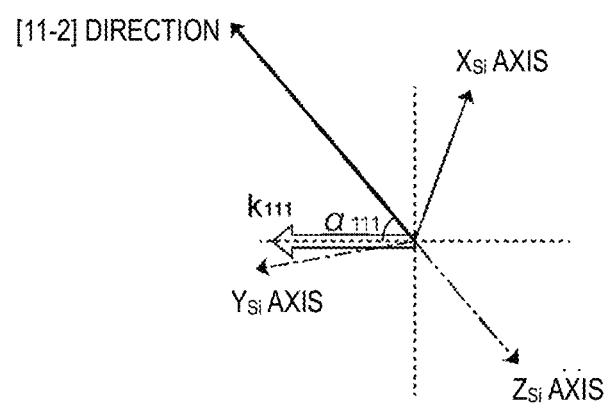
FIG. 11 is a schematic view for explaining an angle $\alpha_{111}$.

FIG. 10 is a schematic view illustrating a [11-2] direction of silicon. FIG. 11 is a schematic view for explaining the angle $\alpha_{111}$.

As illustrated in FIG. 10, the [11-2] direction of silicon is represented as a composite vector of a unit vector in the $X_{Si}$ direction, a unit vector in the $Y_{Si}$ direction, and a vector that is −2 times a unit vector in the $Z_{Si}$ direction in the crystal structure of silicon. As illustrated in FIG. 11, the angle $\alpha_{111}$ is an angle between the direction vector $k_{111}$ and the [11-2] direction of silicon defining the silicon substrate 2. As described above, the [11-2] direction, a [1-21] direction, and a [−211] direction are equivalent due to the symmetry of the crystal of silicon.

On the other hand, in a silicon substrate having a plane orientation of (110), a direction vector obtained by projecting the $Z_P$ axis onto the (110) plane of the silicon substrate is defined as $k_{110}$. The angle $\alpha_{110}$ is an angle between the direction vector $k_{110}$ and a [001] direction of silicon defining the silicon substrate. The [001] direction, a [100] direction, and a [010] direction are equivalent due to the symmetry of the crystal of silicon.

In a silicon substrate having a plane orientation of (100), a direction vector obtained by projecting the $Z_P$ axis onto the (100) plane of the silicon substrate is defined as $k_{100}$. The angle $\alpha_{100}$ is an angle between the direction vector $k_{100}$ and the [001] direction of silicon defining the silicon substrate.

The definitions of the direction vector k and the angle $\alpha$ are the same regardless of whether the silicon substrate is directly laminated on the piezoelectric film or indirectly laminated on the piezoelectric film with another layer interposed therebetween. In the case illustrated in FIG. 1, the silicon substrate 2 and the piezoelectric film 7 are indirectly laminated with the first high-acoustic-velocity film 3, the first low-acoustic-velocity film 4, the second low-acoustic-velocity film 5, and the second high-acoustic-velocity film 6 interposed therebetween. Also in this case, the angle $\alpha_{100}$, the angle $\alpha_{110}$, or the angle $\alpha_{111}$ is defined based on the plane orientation of the silicon substrate 2.

A comparison between the present preferred embodiment and a comparative example indicates that the acoustic wave device 1 can reduce or prevent a higher-order mode and the like over a wide band.

Figure 12:
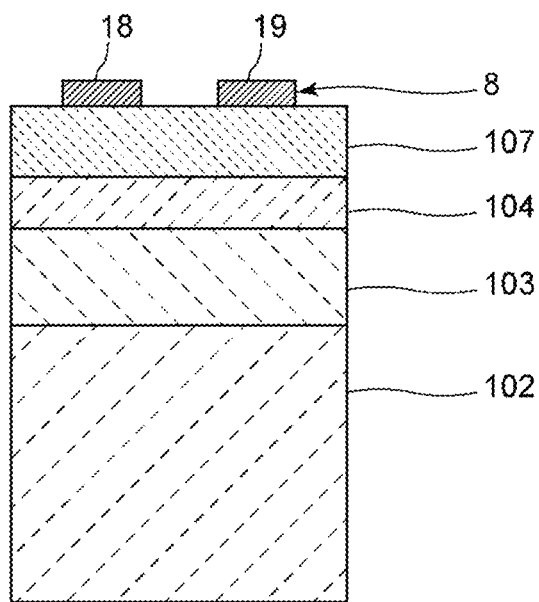
FIG. 12 is a front cross-sectional view illustrating a layer configuration of a portion of an acoustic wave device according to a comparative example.

As illustrated in FIG. 12, the comparative example is different from the first preferred embodiment in the multilayer structure. In the comparative example, a silicon substrate 102, a high-acoustic-velocity film 103, a low-acoustic-velocity film 104, and a piezoelectric film 107 are laminated in this order.

Phase characteristics of the acoustic wave device having the configuration according to the first preferred embodiment and that of the comparative example are compared. Design parameters of the acoustic wave device having the configuration according to the first preferred embodiment are as follows. Note that the Euler angles of the silicon substrate 2 are represented by ($Si\varphi$, $Si\theta$, $Si\psi$).

Silicon substrate 2: plane orientation: (111), $Si\psi$ in Euler angles ($Si\varphi$, $Si\theta$, $Si\psi$): about 46°

First high-acoustic-velocity film 3: material: SiN, thickness: about 300 nm

First low-acoustic-velocity film 4: material: SiO$_2$, thickness: about 100 nm

Second low-acoustic-velocity film 5: material: Ta$_2$O$_5$, thickness: about 70 nm Second high-acoustic-velocity film 6: material: SiN, thickness: about 70 nm Piezoelectric film 7: material: 40° Y-cut X-propagation LiTaO$_3$, thickness: about 350 nm Layer configuration of IDT electrode 8: layer configuration: Ti layer/Al layer/Ti layer from piezoelectric film 7 side, thicknesses: about 12 nm/about 100 nm/about 4 nm from the piezoelectric film 7 side Design parameters of the acoustic wave device according to the comparative example are as follows.

Silicon substrate 102: plane orientation: (111), Siψ in Euler angles (Siφ, Siθ, Siψ): about 73°

High-acoustic-velocity film 103: material: SiN, thickness: about 300 nm

Low-acoustic-velocity film 104: material: SiO$_2$, thickness: about 300 nm

Piezoelectric film 107: material: 55° Y-cut X-propagation LiTaO$_3$, thickness: about 400 nm Layer configuration of IDT electrode 8: layer configuration: Ti layer/Al layer/Ti layer from the piezoelectric film 107 side, thicknesses: about 12 nm/about 100 nm/about 4 nm from the piezoelectric film 7 side FIG. 13 is a diagram illustrating phase characteristics of the acoustic wave devices according to the first preferred embodiment and the comparative example.

Figure 13:
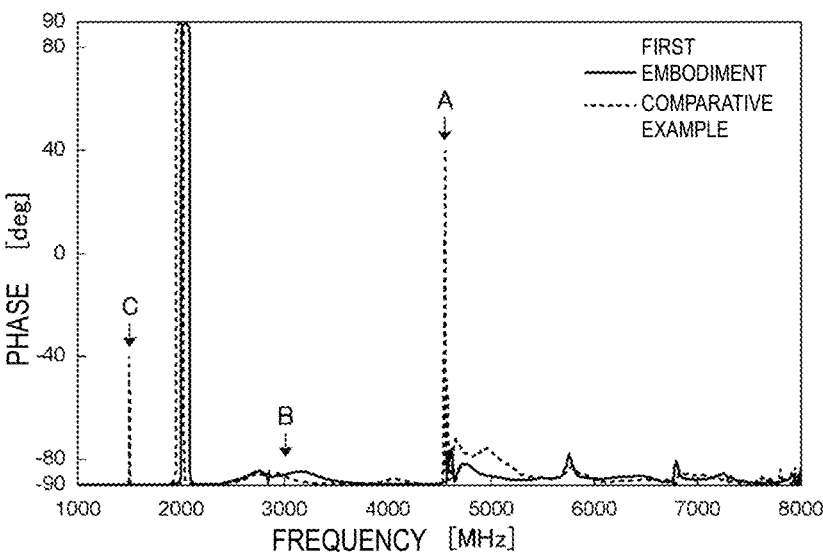
FIG. 13 is a diagram illustrating phase characteristics of acoustic wave devices according to the first preferred embodiment of the present invention and a comparative example.

As indicated by an arrow A in FIG. 13, in the comparative example, a higher-order mode occurs around 2.2 times the resonant frequency. On the other hand, in the first preferred embodiment, it can be seen that the higher-order mode around 2.2 times the resonant frequency is reduced or prevented. In addition, as indicated by an arrow B, in the first preferred embodiment, it is also possible to reduce or prevent a higher-order mode around 1.5 times the resonant frequency. Furthermore, in the first preferred embodiment, unwanted waves of a higher-order mode and the like can be suppressed, compared with the comparative example, over a wide range around about 4000 MHz to about 5500 MHz. As described above, in the first preferred embodiment, unwanted waves of a higher-order mode and the like can be reduced or prevented over a wide band.

Here, a thickness of the first high-acoustic-velocity film 3 is preferably, for example, equal to or larger than a thickness of the second high-acoustic-velocity film 6. In this case, a higher-order mode can be further reduced or prevented. Details of this advantageous effect will be provided below.

In an acoustic wave device according to a preferred embodiment of the present invention, the phase characteristics were measured while the thickness of the second high-acoustic-velocity film 6 was fixed and the thickness of the first high-acoustic-velocity film 3 was changed. To be specific, the thickness of the second high-acoustic-velocity film 6 was set to about 300 nm. The thickness of the first high-acoustic-velocity film 3 was set to about 100 nm or about 500 nm. Thus, in one acoustic wave device, the thickness of the first high-acoustic-velocity film 3 is smaller than the thickness of the second high-acoustic-velocity film 6. This is referred to as Example 1 of a preferred embodiment of the present invention. In the other acoustic wave device, the thickness of the first high-acoustic-velocity film 3 is larger than the thickness of the second high-acoustic-velocity film 6. This is referred to as Example 2 of a preferred embodiment of the present invention.

Figure 14:
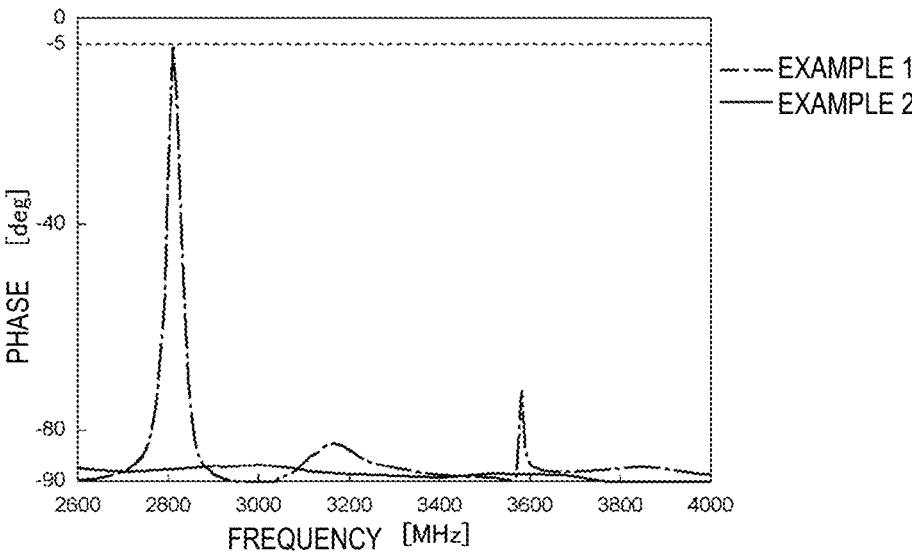
FIG. 14 is a diagram illustrating phase characteristics in Examples 1 and 2 of preferred embodiments of the present invention.

FIG. 14 is a diagram illustrating phase characteristics in Example 1 and Example 2.

As illustrated in FIG. 14, in both Example 1 and Example 2, a higher-order mode around 2800 MHz is reduced or prevented to be less than about −5 deg. In addition, in both Example 1 and Example 2, an unwanted wave is reduced or prevented over a wide range of about 2600 MHz to about 4000 MHz. Here, in Example 2, it was discovered that a higher-order mode around 2800 MHz is further reduced or prevented compared with Example 1. As described above, when the thickness of the first high-acoustic-velocity film 3 is equal to or larger than the thickness of the second high-acoustic-velocity film 6, a higher-order mode can be further suppressed.

The thickness of the first low-acoustic-velocity film 4 is preferably larger than or equal to the thickness of the second low-acoustic-velocity film 5. In this case, a higher-order mode can be further reduced or prevented. Details of this advantageous effect will be provided below.

In an acoustic wave device according to a preferred embodiment of the present invention, phase characteristics were measured while the thickness of the first low-acoustic-velocity film 4 and the thickness of the second low-acoustic-velocity film 5 were made different from each other. Specifically, in one acoustic wave device, the thickness of the first low-acoustic-velocity film 4 was set to about 100 nm and the thickness of the second low-acoustic-velocity film 5 was set to about 300 nm. In the acoustic wave device, the thickness of the first low-acoustic-velocity film 4 is smaller than the thickness of the second low-acoustic-velocity film 5. This is referred to as Example 3 of a preferred embodiment of the present invention. In the other acoustic wave device, the thickness of the first low-acoustic-velocity film 4 was set to about 300 nm and the thickness of the second low-acoustic-velocity film 5 was set to about 100 nm. In the acoustic wave device, the thickness of the first low-acoustic-velocity film 4 is larger than the thickness of the second low-acoustic-velocity film 5. This is referred to as Example 4 of a preferred embodiment of the present invention.

Figure 15:
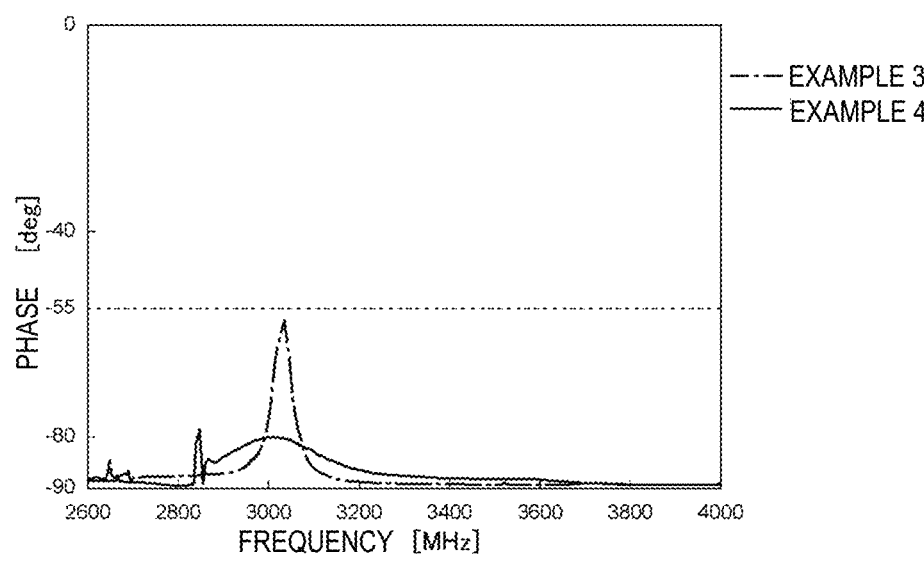
FIG. 15 is a diagram illustrating phase characteristics in Examples 3 and 4 of preferred embodiments of the present invention.

FIG. 15 is a diagram illustrating phase characteristics in Example 3 and Example 4.

As illustrated in FIG. 15, in both Example 3 and Example 4, a higher-order mode around 3000 MHz is reduced to be less than about −55 deg. In addition, in both Example 3 and Example 4, an unwanted wave is suppressed over a wide range of about 2600 MHz to about 4000 MHz. Here, it can be seen that in Example 4, a higher-order mode around 3000 MHz is further reduced or prevented compared with Example 3. As described above, when the thickness of the first low-acoustic-velocity film 4 is equal to or larger than the thickness of the second low-acoustic-velocity film 5, a higher-order mode can be further reduced or prevented.

The thickness of the first high-acoustic-velocity film 3 is preferably equal to or larger than the thickness of the first low-acoustic-velocity film 4. This makes it possible to further suppress a higher-order mode. Details of this advantageous effect will be provided below.

In an acoustic wave device according to a preferred embodiment of the present invention, the phase characteristics were measured while each of the thickness of the first high-acoustic-velocity film 3 and the thickness of the first low-acoustic-velocity film 4 was made different from each other. Specifically, in one acoustic wave device, the thickness of the first high-acoustic-velocity film 3 was set to about 300 nm, and the thickness of the first low-acoustic-velocity film 4 was set to about 100 nm. In the acoustic wave device, the thickness of the first high-acoustic-velocity film 3 is larger than the thickness of the first low-acoustic-velocity film 4. This is referred to as Example 5 of a preferred embodiment of the present invention. In the other acoustic wave device, the thickness of the first high-acoustic-velocity film 3 was set to about 100 nm and the first low-acoustic-velocity film 4 was set to about 300 nm. In the acoustic wave device, the thickness of the first high-acoustic-velocity film 3 is smaller than the thickness of the first low-acoustic-velocity film 4. This is referred to as Example 6 of a preferred embodiment of the present invention.

Figure 16:
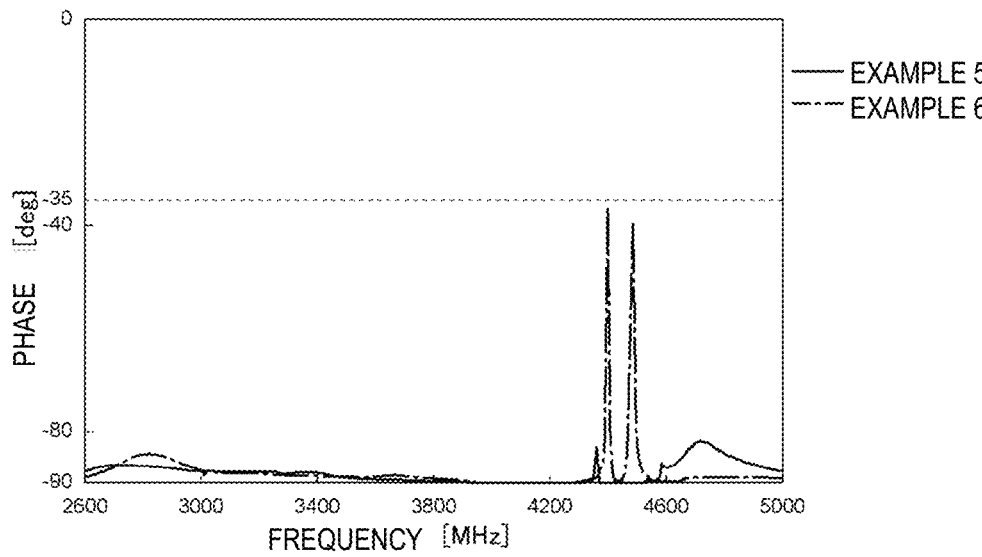
FIG. 16 is a diagram illustrating phase characteristics in Examples 5 and 6 of preferred embodiments of the present invention.

FIG. 16 is a diagram illustrating phase characteristics in Example 5 and Example 6.

As illustrated in FIG. 16, in both Example 5 and Example 6, a higher-order mode around 4400 MHz is suppressed to be less than about −35 deg. In addition, in both Example 5 and Example 6, an unwanted wave is reduced over a wide range of about 2600 MHz to about 5000 MHz. Here, it can be seen that in Example 5, a higher-order mode around 4400 MHz is further reduced or prevented compared with Example 6. As described above, when the thickness of the first high-acoustic-velocity film 3 is equal to or larger than the thickness of the first low-acoustic-velocity film 4, a higher-order mode can be further reduced or prevented.

As indicated by an arrow C in FIG. 13, in the comparative example, a Rayleigh wave as an unwanted wave is generated at a frequency around 0.7 times the resonant frequency. On the other hand, it can be seen that the Rayleigh wave is reduced or prevented in the first preferred embodiment. This is because in the acoustic wave device 1, the piezoelectric film 7 is formed from a LiTaO$_3$ film and its cut angle is about 40° Y. It has been discovered that the same or similar advantageous effect can be obtained when the cut angle is within a range of about (40±5)° Y. Thus, when the piezoelectric film 7 is made of the LiTaO$_3$ film, the cut angle is preferably within a range of about (40±5)° Y. As a result, the Rayleigh wave can be reduced or prevented.

A dielectric film may be provided on the piezoelectric film 7 so as to cover the IDT electrode 8, the reflector 9A, and the reflector 9B. As a material of the dielectric film, for example, silicon oxide, silicon nitride, silicon oxynitride, or the like can be used. However, the acoustic wave device 1 does not need to include the dielectric film.

Here, a wavelength defined by an electrode finger pitch of the IDT electrode 8 is defined as λ. The electrode finger pitch refers to a distance between the centers of electrode fingers that are adjacent to each other. Specifically, the distance refers to a distance obtained by connecting center points in the acoustic wave propagation direction, that is, in the X direction in each of the adjacent electrode fingers. When the distance between the centers of the electrode fingers is not constant, the electrode finger pitch is defined as an average value of the distance between the centers of the electrode fingers.

Further, the thickness of the first high-acoustic-velocity film 3 is defined as t_SiN−1[λ], and the thickness of the second high-acoustic-velocity film 6 is defined as t_SiN−2 [λ]. The thicknesses of the first low-acoustic-velocity film 4 is defined as t_SiO2 [λ], and the thickness of the second low-acoustic-velocity film 5 is defined as t_Ta2O5 [λ]. The thickness of the piezoelectric film 7 is defined as t_LT[λ]. A higher-order mode at a frequency that is about 1.5 times the resonant frequency is referred to as a first higher-order mode. While each of t_SiN−1[λ], t_SiN−2[λ], t_SiO2[λ], t_Ta2O5[λ], t_LT[λ], LTθ, and Siψ was changed, a phase of the first higher-order mode was measured. Note that the plane orientation of the silicon substrate 2 was set to (111). Thus, Equation 1, which is a relational expression of the parameters and the phase of the first higher-order mode, was derived.

Phase of spurious wave [deg]

=(−64.7738492449743)+0.799535874292877

*(Siψ−23.2121158601201)+−0.00639116627879308

*(LTθ−131.246414694454)+228.498817195313

*((t_LT[λ])−0.180166902154725)+−551.916118464126

*((t_SiN−2[λ])−0.0291537442599814)+1142.73591823813

*((t_Ta$_2$O$_5$[λ])−0.0421024373013005)+155.359547985879

*((t_SiO2[λ])−0.121307841752057)+−29.8438742957074

*((t_SiN−1[λ])−0.263987107029325)+−0.0245466642133507*

((Siψ−23.2121158601201)

*(Siψ−23.2121158601201)−540.379061966296)+−0.00862413439802871

*((Siψ−23.2121158601201)*(LTθ−131.246414694454))+

0.249067774425361

*((LTθ−131.246414694454)*(LTθ−131.246414694454)−

5.81473016925011)+6.93659125135011

*((Siψ−23.2121158601201)*((t_LT[λ])−0.180166902154725))+

10.0784200297745

*((LTθ−131.246414694454)*((t_LT[λ])−

0.180166902154725))+116.492602498829

*(((t_LT[λ])−0.180166902154725)

*((t_LT[λ])−0.180166902154725)−0.000346559038760835)+

6.96592368109737

*((Siψ−23.2121158601201)*((t_SiN−2[λ])−0.0291537442599814))

+−15.0647392900912*((LTθ−131.246414694454)*((t_SiN−2[λ])−

0.0291537442599814))+3185.48452246456

*(((t_LT[λ])−0.180166902154725)*((t_SiN−2[λ])−

0.0291537442599814))+6533.48929488482

*(((t_SiN−2[λ])−0.0291537442599814)

*((t_SiN−2[λ])−0.0291537442599814)−0.000458154170897422)+

7.78801893149455

*((Siψ−23.2121158601201)*((t_Ta2O5[λ])−0.0421024373013005))

+53.7418010590521*((LTθ−131.246414694454)*((t_Ta2O5[λ])

0.0421024373013005))+6146.78344504674

*((($t\_LT$[λ])−0.180166902154725)*(($t\_$Ta2O5[λ])−

0.0421024373013005))+−14578.5920718871

*((($t\_$SiN−2[λ])−0.0291537442599814)*(($t\_$Ta2O5
[λ])−

0.0421024373013005))+28614.912170246

*((($t\_$Ta2O5[λ])−0.0421024373013005)*(($t\_$Ta2O5
[λ])−

0.0421024373013005)−0.000324766882084902)+
4.59563385312738

*((Siψ−23.2121158601201)*(($t\_$SiO2[λ])−
0.121307841752057))

+1.7616110343796

*((($LT$θ−131.246414694454)*(($t\_$SiO2[λ])−
0.121307841752057))

+1984.12416812403

*((($t\_LT$[λ])−0.180166902154725)*(($t\_$SiO2[λ])−

0.121307841752057))+−202.795292688935

*((($t\_$SiN−2[λ])−0.0291537442599814)*(($t\_$SiO2
[λ])−

0.121307841752057))+5166.03124069752

*((($t\_$Ta2O5[λ])−0.0421024373013005)

*(($t\_$SiO2[λ])−0.121307841752057))+−
346.648683117878*

(($t\_$SiO2[λ])−0.121307841752057)

*(($t\_$SiO2[λ])−0.121307841752057−
0.0017442053041025)

+1.13949852542765

*((Siψ−23.2121158601201)*(($t\_$SiN−1[λ])−

0.263987107029325))+−2.10309868792554

*(($LT$θ−131.246414694454)*(($t\_$SiN−1[λ])−

0.263987107029325))+342.49568371403*(($t\_LT$[λ])−

0.180166902154725)*(($t\_$SiN−1[λ])−
0.263987107029325))+

735.741591105701

*((($t\_$SiN−2[λ])−0.0291537442599814)

*(($t\_$SiN−1[λ])−0.263987107029325))+−
2014.8497951455

*((($t\_$Ta2O5[λ])−0.0421024373013005)*(($t\_$SiN−1
[λ])−

0.263987107029325))+131.054784086532

*((($t\_$SiO2[λ])−0.121307841752057)*(($t\_$SiN−1[λ])−

0.263987107029325))+145.441965448516

*((($t\_$SiN−1[λ])−0.263987107029325)*(($t\_$SiN−1
[λ])−

0.263987107029325)−0.0132035793109828).  Equation 1

When the plane orientation of the silicon substrate 2 is set
to (111), it is preferable that the phase derived from Equation
1 be equal to or less than about −70 deg. To be more specific,
it is preferable that t_SiN−1[λ], t_SiN−2[λ], t_SiO2[λ],
t_Ta2O5[λ], t_LT[λ], LTθ, and Siψ be thicknesses and
angles within a range in which the phase derived by Equa-
tion 1 is equal to or less than about −70 deg. This makes it
possible to more reliably set the phase of the first higher-
order mode to be equal to or less than about −70 deg. Thus,
the first higher-order mode can be more reliably and effec-
tively reduced or prevented.

A higher-order mode at a frequency that is about 2.2 times
the resonant frequency is referred to as a second higher-
order mode. The phases of the first higher-order mode and
the second higher-order mode were measured in the same or
similar manner to that in the derivation of Equation 1. Note
that the plane orientation of the silicon substrate 2 was set to
(111). Thus, Equation 2, which is a relational expression of
the parameters and the phases of the first higher-order mode
and the second higher-order mode, was derived.

Phase of spurious wave [deg]

=(−49.4236088933048)+0.927126211958592

*(Siψ−23.2121158601201)+0.680023816107774*
($LT$θ−

131.246414694454)+213.742276430449

*(($t\_LT$[λ])−0.180166902154725)+−
606.139116757393

*(($t\_$SiN−2[λ])−0.0291537442599814)+
692.814216558718

*(($t\_$Ta2O5[λ])−0.0421024373013005)+
195.183979143557

*(($t\_$SiO2[λ])−0.121307841752057)+−
83.0452792358909

*(($t\_$SiN−1[λ])−0.263987107029325)+−
0.0279599052855905*

((Siψ−23.2121158601201)

*(Siψ−23.2121158601201)−540.379061966296)+−

0.0139285317562481

*((Siψ−23.2121158601201)*($LT$θ−
131.246414694454))+

0.293983576167198

*(($LT$θ−131.246414694454)*($LT$θ−
131.246414694454)−

5.81473016925011)+9.82906312217327

*((Siψ−23.2121158601201)*($t\_LT$[λ])−
0.180166902154725))+

20.4897039882144

*(($LT$θ−131.246414694454)*(($t\_LT$[λ])−
0.180166902154725))+−

1822.1825017687

*((($t\_LT$[λ])−0.180166902154725)

$*((t\_LT[\lambda])-0.180166902154725)-$
$\quad 0.000346559038760835)+$ $6.57985243569614$ $*((Si\phi-23.2121158601201)*((t\_SiN-2[\lambda])-$ $0.0291537442599814))+-16.3487857288392$ $*((LT\theta-131.246414694454)*((t\_SiN-2[\lambda])-$
$\quad 0.0291537442599814))$ $+3022.4142953683$ $*(((t\_LT[\lambda])-0.180166902154725)*((t\_SiN-2[\lambda])-$ $0.0291537442599814))+6106.28960321182$ $*(((t\_SiN-2[\lambda])-0.0291537442599814)$ $*((t\_SiN-2[\lambda])-0.0291537442599814)-$
$\quad 0.000458154170897422)+$ $7.61287198883346$ $*((Si\psi-23.2121158601201)*((t\_Ta2O5[\lambda])-$
$\quad 0.0421024373013005))$ $+32.0420324509525$ $*((LT\theta-131.246414694454)*((t\_Ta2O5[\lambda])-$ $0.0421024373013005))+-5600.23059801591$ $*(((t\_LT[\lambda])-0.180166902154725)*((t\_Ta2O5[\lambda])-$ $0.0421024373013005))+-12480.4143612638$ $*(((t\_SiN-2[\lambda])-0.0291537442599814)$ $*((t\_Ta2O5[\lambda])-0.0421024373013005))+$
$\quad 9462.56388912554$ $*(((t\_Ta2O5[\lambda])-0.0421024373013005)$ $*((t\_Ta2O5[\lambda])-0.0421024373013005)-$
$\quad 0.000324766882084902)+$ $4.75660770269025$ $*((Si\psi-23.2121158601201)*((t\_SiO2[\lambda])-$
$\quad 0.121307841752057))$ $+3.138310645423$ $*((LT\theta-131.246414694454)*((t\_SiO2[\lambda])-$
$\quad 0.121307841752057))+$ $782.245112149574$ $*(((t\_LT[\lambda])-0.180166902154725)*((t\_SiO2[\lambda])-$ $0.121307841752057))+-1849.48045553917$ $*(((t\_SiN-2[\lambda])-0.0291537442599814)*((t\_SiO2$
$\quad [\lambda])-$ $0.121307841752057))+-657.25929805289$ $*(((t\_Ta2O5[\lambda])-0.0421024373013005)$ $*((t\_SiO2[\lambda])-0.121307841752057))+-$
$\quad 111.444658339511*$ $(((t\_SiO2[\lambda])-0.121307841752057)$ $*((t\_SiO2[\lambda])-0.121307841752057)-$
$\quad 0.0017442053041025)$ $+1.37817174855647$ $*((Si\psi-23.2121158601201)*((t\_SiN-1[\lambda])-$
$\quad 0.263987107029325))$ $+-1.7087256650039$ $*((LT\theta-131.246414694454)*((t\_SiN-1[\lambda])-$ $0.263987107029325))+-396.636995545448$ $*(((t\_LT[\lambda])-0.180166902154725)*((t\_SiN-1[\lambda])-$ $0.263987107029325))+434.882453748749$ $*(((t\_SiN-2[\lambda])-0.0291537442599814)$ $*((t\_SiN-1[\lambda])-0.263987107029325))+-$
$\quad 1660.0685005439$ $*(((t\_Ta2O5[\lambda])-0.0421024373013005)*((t\_SiN-1$
$\quad [\lambda])-$ $0.263987107029325))+106.322544176659$ $*(((t\_SiO2[\lambda])-0.121307841752057)*((t\_SiN-1[\lambda])-$ $0.263987107029325))+172.372246831877$ $*(((t\_SiN-1[\lambda])-0.263987107029325)$ $*((t\_SiN-1[\lambda])-0.263987107029325)-$
$\quad 0.0132035793109828).$      Equation 2

When the plane orientation of the silicon substrate 2 is set to (111), it is preferable that the phase derived from Equation 2 be equal to or less than about −70 deg. To be more specific, it is preferable that t_SiN-1[λ], t_SiN-2[λ], t_SiO2[λ], t_Ta2O5[λ], t_LT[λ], LTθ, and Siψ be thicknesses and angles within a range in which the phase derived by Equation 2 is equal to or less than about −70 deg. Due to this, the phases of the first higher-order mode and the second higher-order mode can be more reliably set to be equal to or less than about −70 deg. Thus, the first higher-order mode and the second higher-order mode can be more reliably and effectively reduced or prevented.

The phases of a Rayleigh wave, the first higher-order mode, and the second higher-order mode were measured in the same or similar manner to that in the derivation of Equation 1. The plane orientation of the silicon substrate 2 was set to (111). Thus, Equation 3, which is a relational expression of the parameters and the phases of the Rayleigh wave, the first higher-order mode, and the second higher-order mode, was derived.

Phase of spurious wave [deg]

$(-49.446344512493)+0.926632614160644$ $*(Si\psi-23.2121158601201)+0.689805009201412*(\theta-$ $131.246414694454)+213.186056884304$ $*((t\_[\lambda])-0.180166902154725)+-605.162234862408$ $*((t\_SiN-2[\lambda])-0.0291537442599814)+$
$\quad 693.090367188157$ $*((t\_Ta2O5[\lambda])-0.0421024373013005)+$
$\quad 194.973246854906$

*((t_SiO2[λ])−0.121307841752057)+−
    82.9891258698242

*((t_SiN−1[λ])−0.263987107029325)+−
    0.0279312228697236*

((Siψ−23.2121158601201)

*(Siψ−23.2121158601201)−540.379061966296)+−

0.0129242968044351

*((Siψ−23.2121158601201)*(θ−
    131.246414694454))+

0.285438486600616

*((θ−131.246414694454)*(θ−131.246414694454)−

5.81473016925011)+9.7873873803375

*((Siψ−23.2121158601201)*((t_[λ])−
    0.180166902154725))+

20.1009127346539

*((ψ−131.246414694454)*((t_[λ])−
    0.180166902154725))

+−1845.21253448418

*((((t_[λ])−0.180166902154725)

*((t_[λ])−0.180166902154725)−
    0.000346559038760835)+

6.50543677488646

*((Siψ−23.2121158601201)*((t_SiN−2[λ]−
    0.0291537442599814))

+−17.1312681888354

*((θ−131.246414694454)*((t_SiN−2[λ])−
    0.0291537442599814))

+3096.79723705848

*((((t_[λ])−0.180166902154725)*((t_SiN−2[λ])−

0.0291537442599814))+6184.77577365764

*(((t_SiN−2[λ])−0.0291537442599814)

*((t_SiN−2[λ])−0.0291537442599814)−
    0.000458154170897422)+

7.56134934721394

*((Siψ−23.2121158601201)*((t_Ta2O5[λ])−
    0.0421024373013005))

+31.4231915519825

*((θ−131.246414694454)*((t_Ta2O5[λ])−

0.0421024373013005))+−5550.14180216517

*((((t_[λ])−0.180166902154725)*((t_Ta2O5[λ])−

0.0421024373013005))+−12378.8114606327

*(((t_SiN−2[λ])−0.0291537442599814)

*((t_Ta2O5[λ])−0.0421024373013005))+
    9488.76758932007

*((((t_Ta2O5[λ])−0.0421024373013005)

*((t_Ta2O5[λ])−0.0421024373013005)−
    0.000324766882084902)+

4.72906984538813

*((Siψ−23.2121158601201)*((t_SiO2[λ])−
    0.121307841752057))

+2.92834698440594

*((θ−131.246414694454)*((t_SiO2[λ])−
    0.121307841752057))+

795.397518262681

*((((t_[λ])−0.180166902154725)*((t_SiO2[λ])−

0.121307841752057))+−1810.07736779714

*(((t_SiN−2[λ])−0.0291537442599814)*((t_SiO2
    [λ])−

0.121307841752057))+−633.635642829976

*(((t_Ta2O5[λ])−0.0421024373013005)

*((t_SiO2[λ])−0.121307841752057))+−
    115.182409805846*

(((t_SiO2[λ])−0.121307841752057)

*((t_SiO2[λ])−0.121307841752057)−
    0.0017442053041025)+

1.36398286740725

*((Siψ−23.2121158601201)*((t_SiN−1[λ])−

0.263987107029325))+−1.83297695480188

*((θ−131.246414694454)*((t_SiN−1[λ])−
    0.263987107029325))

+−387.007695236215

*((((t_[λ])−0.180166902154725)*((t_SiN−1[λ])−

0.263987107029325))+456.19886315614

*(((t_SiN−2[λ])−0.0291537442599814)

*((t_SiN−1[λ])−0.263987107029325))+−
    1644.59679209231

*(((t_Ta2O5[λ])−0.0421024373013005)*((t_SiN−1
    [λ])−

0.263987107029325))+113.144234117703

*(((t_SiO2[λ])−0.121307841752057)*((t_SiN−1[λ])−

0.263987107029325))+173.438761951382

*(((t_SiN−1[λ])−0.263987107029325)*((t_SiN[λ])−

0.263987107029325)−0.0132035793109828).     Equation 3

When the plane orientation of the silicon substrate 2 is set
to (111), it is preferable that the phase derived from Equation
3 be equal to or less than about −70 deg. To be more specific, it is preferable that t_SiN–1[λ], t_SiN–2[λ], t_SiO2[λ], t_Ta2O5[λ], t_LT[λ], LTθ, and Siψ be thicknesses and angles within a range in which the phase derived by Equation 3 is equal to or less than about −70 deg. Due to this, the phases of the Rayleigh wave, the first higher-order mode, and the second higher-order mode can be more reliably set to be equal to or less than about −70 deg. Thus, it is possible to more reliably and effectively reduce or prevent the Rayleigh wave, the first higher-order mode, and the second higher-order mode.

While the plane orientation of the silicon substrate 2 was set to (110), and the phase of the first higher-order mode was measured in the same or similar manner to that in the derivation of Equation 1. Thus, Equation 4, which is a relational expression of the parameters and the phase of the first higher-order mode, was derived.

Phase of spurious wave [deg]

$=(-35.4828976785632)+-565.645491469017$ $*((t\_SiN-2[\lambda])-0.0350204955532028)+ 1015.0372961359$ $*((t\_Ta2O5[\lambda])-0.0349996340079728)+ 144.752343074804$ $*((t\_SiO2[\lambda])-0.125000914980053)+- 46.0415586945303$ $*((t\_SiN-1[\lambda])-0.224927716575792)+ 1.04686816500004$ $*((Si\psi[deg])-45.0067708523954)+ 10682.9573639156*(((t\_SiN-$ $2[\lambda])$ $-0.0350204955532028)$ $*((t\_SiN-2[\lambda])-0.0350204955532028)- 0.000399831223602513)+-$ $13343.4260197881$ $*(((t\_SiN-2[\lambda])-0.0350204955532028)$ $*((t\_Ta2O5[\lambda])-0.0349996340079728))+ 14953.0137418577$ $*(((t\_Ta2O5[\lambda])-0.0349996340079728)$ $*((t\_Ta2O5[\lambda])-0.0349996340079728)- 0.000400054898669248)$ $+739.132582722994$ $*(((t\_SiN-2[\lambda])-0.0350204955532028)*((t\_SiO2 [\lambda])-$ $0.125000914980053))+4235.91445978005$ $*(C((t\_Ta2O5[\lambda])-0.0349996340079728)*((t\_SiO2 [\lambda])-$ $0.125000914980053))+209.756610061409$ $*(((t\_SiO2[\lambda])-0.125000914980053)$ $*((t\_SiO2[\lambda])-0.125000914980053)- 0.00250052611269396)$ $+575.276037855751$ $*(((t\_SiN-2[\lambda])-0.0350204955532028)$ $*((t\_SiN-1[\lambda])-0.224927716575792))+- 1900.54066286617$ $*(((t\_Ta2O5[\lambda])-0.0349996340079728)$ $*((t\_SiN-1[\lambda])-0.224927716575792))+- 361.044865348212*$ $(((t\_SiO2[\lambda])-0.125000914980053)$ $*((t\_SiN-1[\lambda])-0.224927716575792))+- 12.6866065936889*$ $(((t\_SiN-1[\lambda])-0.224927716575792)$ $*((t\_SiN-1[\lambda])-0.224927716575792)- 0.0131316741294957)+-$ $15.0286853820076$ $*(((t\_SiN-2[\lambda])-0.0350204955532028)*((Si\psi)-$ $45.0067708523954))+2.30649064625795$ $*(((t\_Ta2O5[\lambda])-0.0349996340079728)*((Si\psi)-$ $45.0067708523954))+-2.93242042531494$ $*(((t\_SiO2[\lambda])-0.125000914980053)*((Si\psi)-$ $45.0067708523954))+0.490207176672433$ $*(((t\_SiN-1[\lambda])-0.224927716575792)*((Si\psi)-$ $45.0067708523954))+0.0236394426428729$ $*(((Si\psi)-45.0067708523954)*((Si\psi[deg])- 45.0067708523954)-$ $825.841735805153).$      Equation 4

When the plane orientation of the silicon substrate 2 is set to (110), it is preferable that the phase derived from Equation 4 be equal to or less than about −70 deg. To be more specific, it is preferable that t_SiN–1[λ], t_SiN–2[λ], t_SiO2[λ], t_Ta2O5[λ], and Siψ be thicknesses and angles within a range in which the phase derived by Equation 4 is equal to or less than about −70 deg. This makes it possible to more reliably set the phase of the first higher-order mode to be equal to or less than about −70 deg. Thus, the first higher-order mode can be more reliably and effectively reduced or prevented.

While the plane orientation of the silicon substrate 2 was set to (110), the phases of the first higher-order mode and the second higher-order mode were measured in the same or similar manner to that in the derivation of Equation 1. Thus, Equation 5, which is a relational expression of the parameters and the phases of the first higher-order mode and the second higher-order mode, was derived.

Phase of spurious wave [deg]

$(-21.043074633666)+-607.846047314191$ $*((t\_SiN-2[\lambda])-0.0350204955532028)+ 835.570016969633$ $*((t\_Ta2O5[\lambda])-0.0349996340079728)+ 218.780632745606$ $*((t\_SiO2[\lambda])-0.125000914980053)+- 72.9770468417362$

*(($t$_SiN−1[λ])−0.224927716575792)+
0.771180072449541

*((Siψ)−45.0067708523954)+9068.29091824635*
(((($t$_SiN−

2[λ])−0.0350204955532028)

*(($t$_SiN−2[λ])−0.0350204955532028)−
0.000399831223602513)+−

13159.8293417283

*(((($t$_SiN−2[λ])−0.0350204955532028)

*(($t$_Ta2O5[λ])−0.0349996340079728))+−
12965.3688204255

*(((($t$_Ta2O5[λ])−0.0349996340079728)

*(($t$_Ta2O5[λ])−0.0349996340079728)−
0.000400054898669248)

+−902.346601423572

*(((($t$_SiN−2[λ])−0.0350204955532028)*(($t$_SiO2
[λ])−

0.125000914980053))+−104.997375301657

*(((($t$_Ta2O5[λ])−0.0349996340079728)*(($t$_SiO2
[λ])−

0.125000914980053))+372.567242377661

*(((($t$_SiO2[λ])−0.125000914980053)

*(($t$_SiO2[λ])−0.125000914980053)−
0.00250052611269396)

+278.515543336254

*(((($t$_SiN−2[λ])−0.0350204955532028)

*(($t$_SiN−1[λ])−0.224927716575792))+−
2340.42700220237

*(((($t$_Ta2O5[λ])−0.0349996340079728)*(($t$_SiN−1
[λ])−

0.224927716575792))+58.3334367716085

*(((($t$_SiO2[λ])−0.125000914980053)*(($t$_SiN−1[λ])−

0.224927716575792))+21.2408634563023

*(((($t$_SiN−1[λ])−0.224927716575792)

*(($t$_SiN−1[λ])−0.224927716575792)−
0.0131316741294957)+−

12.3569961396514

*(((($t$_SiN−2[λ])−0.0350204955532028)*((Siψ)−

45.0067708523954))+6.43899440226174*((($t$_Ta2O5
[λ])−

0.0349996340079728)*((Siψ)−
45.0067708523954))+−

4.05208515458274

*(((($t$_SiO2[λ])−0.125000914980053)*((Siψ)−

45.0067708523954))+0.851602997008135

*(((($t$_SiN−l[λ])−0.224927716575792)*((Siψ)−

45.0067708523954))+0.0186630077404119

*(((Siψ)−45.0067708523954)*((Siψ)−
45.0067708523954)−

825.841735805153). Equation 5

When the plane orientation of the silicon substrate 2 is set to (110), it is preferable that the phase derived from Equation 5 be equal to or less than about −70 deg. To be more specific, it is preferable that t_SiN−1[λ], t_SiN−2[λ], t_SiO2[λ], t_Ta2O5[λ], and Siψf be thicknesses and angles within a range in which the phase derived by Equation 5 is equal to or less than about −70 deg. Due to this, the phases of the first higher-order mode and the second higher-order mode can be more reliably set to be equal to or less than about −70 deg. Thus, the first higher-order mode and the second higher-order mode can be more reliably and effectively reduced or prevented.

When the plane orientation of the silicon substrate 2 is (110) and the piezoelectric film 7 is made a LiTaO$_3$ film, the cut angle of the piezoelectric film 7 is preferably within a range being equal to or more than about 28° Y and equal to or less than about 48° Y. Thereby, in addition to the first higher-order mode and the second higher-order mode, a Rayleigh wave can also be suppressed. The advantageous effect of reducing or preventing the Rayleigh wave will be described in detail below.

Figure 17:
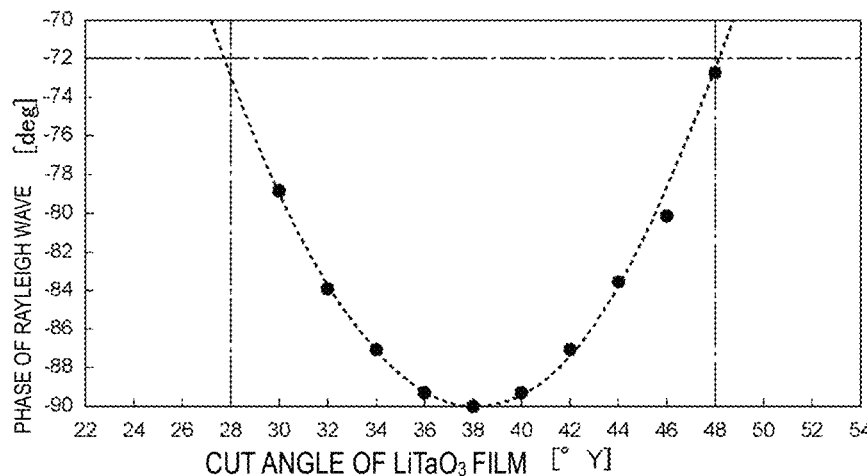
FIG. 17 is a diagram illustrating a relationship between a cut angle of a $LiTaO_3$ film and a phase of a Rayleigh wave.

FIG. 17 is a diagram illustrating a relationship between the cut angle of the LiTaO$_3$ film and the phase of the Rayleigh wave.

As illustrated in FIG. 17, when the piezoelectric film 7 is made of the LiTaO$_3$ film and the cut angle of the piezoelectric film 7 is within a range being equal to or more than about 28° Y and equal to or less than about 48° Y, it can be seen that the phase of the Rayleigh wave is less than about −72 deg. In this way, the Rayleigh wave can be reduced or prevented.

When the phase derived by Equation 4 is equal to or less than about −70 deg and the cut angle of the LiTaO$_3$ film as the piezoelectric film 7 is within the range being equal to or more than about 28° Y and equal to or less than about 48° Y, the Rayleigh wave and at least the first higher-order mode can be reduced or prevented. When the phase derived by Equation 5 is equal to or more than about −70 deg and the cut angle of the LiTaO$_3$ film as the piezoelectric film 7 is within the range being equal to or more than about 28° Y and equal to or less than about 48° Y, it is possible to reduce or prevent the Rayleigh wave, the first higher-order mode, and the second higher-order mode.

While the plane orientation of the silicon substrate 2 was set to (100), the phase of the first higher-order mode was measured in the same or similar manner to that in the derivation of Equation 1. Thus, Equation 6, which is a relational expression of the parameters and the phase of the first higher-order mode, was derived.

Phase of spurious wave [deg]

4.23722010895326+−957.681500681962

*(($t$_SiN−2[λ])−0.032371987951807)+
585.864572529366

*(($t$_Ta2O5[λ])−0.0343161281489591)+−
70.8133543143104

*((t_SiO2[λ])−0.124755271084337)+−
16.2945641374395

*((t_SiN−1[λ])−0.224798055859809)+−
0.502977915315552

*(Siψ−25.0116374589266)+8018.80873572765*
((((t_SiN−2[λ])−

0.032371987951807)

*((t_SiN−2[λ])−0.032371987951807)−
0.000382941581152127)+−

9183.68752253472

*(((t_SiN−2[λ])−0.032371987951807)

*((t_Ta2O5[λ])−0.0343161281489591))+−
3967.44233744993

*(((t_Ta2O5[λ])−0.0343161281489591)

*((t_Ta2O5[λ])−0.0343161281489591)−
0.000397417039992328)+−

219.740749864906

*(((t_SiN−2[λ])−0.032371987951807)*((t_SiO2[λ])−

0.124755271084337))+2921.19191101444

*(((t_Ta2O5[λ])−0.0343161281489591)*((t_SiO2
[λ])−

0.124755271084337))+71.8751971324423

*(((t_SiO2[λ])−0.124755271084337)

*((t_SiO2[λ])−0.124755271084337)−
0.00251119250370505)+−

277.396742510064

*(((t_SiN−2[λ])−0.032371987951807)*((t_SiN−1
[λ])−

0.224798055859809))+−345.970595680112

*(((t_Ta2O5[λ])−0.0343161281489591)

*((t_SiN−1[λ])−0.224798055859809))+−
178.32292070599*

((((t_SiO2[λ])−0.124755271084337)

*((t_SiN−1[λ])−0.224798055859809))+
76.2377854978502*

((((t_SiN−1[λ])−0.224798055859809)

*((t_SiN−1[λ])−0.224798055859809)−
0.0131300933916187)+

8.30689126408323

*(((t_SiN−2[λ])−0.032371987951807)*(Siψ−
25.0116374589266))

+−37.8147686019012

*(((t_Ta2O5[λ])−0.0343161281489591)*(Siψ−

25.0116374589266))+−9.06470966220628

*((((t_SiO2[λ])−0.124755271084337)*(Siψ−
25.0116374589266))

+0.152787017528357

*((((t_SiN−1[λ])−0.224798055859809)*(Siψ−

25.0116374589266))+0.0532078049680315

*((Siψ−25.0116374589266)*(Siψ−
25.0116374589266)−

291.798878808268).          Equation 6

When the plane orientation of the silicon substrate 2 is set to (100), it is preferable that the phase derived from Equation 6 be equal to or less than about −70 deg. To be more specific, it is preferable that t_SiN−1[λ], t_SiN−2[λ], t_SiO2 [λ], t_Ta2O5[λ], and Siψ be thicknesses and angles within a range in which the phase derived by Equation 6 is equal to or less than about −70 deg. This makes it possible to more reliably set the phase of the first higher-order mode to be equal to or less than about −70 deg. Thus, the first higher-order mode can be more reliably and effectively reduced or prevented.

While the plane orientation of the silicon substrate 2 was set to (100), the phases of the first higher-order mode and the second higher-order mode were measured in the same or similar manner to that in the derivation of Equation 1. Thus, Equation 7, which is a relational expression of the parameters and the phases of the first higher-order mode and the second higher-order mode, was derived.

Phase of spurious wave [deg]

=7.99511640601924+−921.506922121376

*((t_SiN−2[λ])−0.032371987951807)+
586.197692765577

*((t_Ta2O5[λ])−0.0343161281489591)+−
19.6299727359544

*((t_SiO2[λ])−0.124755271084337)+−
38.2671139134079

*((t_SiN−1[λ])−0.224798055859809)+−
0.384667404398566

*(Siψ−25.0116374589266)+7292.21326291196*
((((t_SiN−2[λ])−

0.032371987951807)

*((t_SiN−2[λ])−0.032371987951807)−
0.000382941581152127)+−

8838.66675333011

*(((t_SiN−2[λ])−0.032371987951807)

*((t_Ta2O5[λ])−0.0343161281489591))+−
11789.7264976743

*(((t_Ta2O5[λ])−0.0343161281489591)

*((t_Ta2O5[λ])−0.0343161281489591)−
0.000397417039992328)+−

28.4853757228835

*(((t_SiN−2[λ])−0.032371987951807)*((t_SiO2[λ])−

0.124755271084337))+1749.37647871597

*((($t$_Ta2O5[$\lambda$])–0.0343161281489591)*(($t$_SiO2
[$\lambda$])–

0.124755271084337))+594.755965541834

*((($t$_SiO2[$\lambda$])–0.124755271084337)

*(($t$_SiO2[$\lambda$])–0.124755271084337)–
0.0025111925037050S)+–

486.955268584051

*((($t$_SiN–2[$\lambda$])–0.032371987951807)*(($t$_SiN–1
[$\lambda$])–

0.224798055859809))+–829.859217960196

*((($t$_Ta2O5[$\lambda$])–0.0343161281489591)

*(($t$_SiN–1[$\lambda$])–0.224798055859809))+–
285.613819272102*

((($t$_SiO2[$\lambda$])–0.124755271084337)

*(($t$_SiN–1[$\lambda$])–0.224798055859809))+
118.153648828838*

((($t$_SiN–1[$\lambda$])–0.224798055859809)

*(($t$_SiN–1[$\lambda$])–0.224798055859809)–
0.0131300933916187)+

9.20315325922817

*((($t$_SiN–2[$\lambda$])–0.032371987951807)*(Si$\psi$–
25.0116374589266))

+–39.0707606971878

*((($t$_Ta2O5[$\lambda$])–0.0343161281489591)*(Si$\psi$–

25.0116374589266))+–6.93828445692585

*((($t$_SiO2[$\lambda$])–0.124755271084337)*(Si$\psi$–
25.0116374589266))+

–0.327228438235882

*((($t$_SiN–1[$\lambda$])–0.224798055859809)*(Si$\psi$–

25.0116374589266))+0.0471426960942093

*((Si$\psi$–25.0116374589266)*(Si$\psi$–
25.0116374589266)–

291.798878808268).                    Equation 7

When the plane orientation of the silicon substrate 2 is set to (100), it is preferable that the phase derived from Equation 7 be equal to or less than about –70 deg. To be more specific, it is preferable that t_SiN–1[$\lambda$], t_SiN–2[$\lambda$], t_SiO2 [$\lambda$], t_Ta2O5[$\lambda$], and Si$\psi$ be thicknesses and angles within a range in which the phase derived by Equation 7 is equal to or less than about –70 deg. Due to this, the phases of the first higher-order mode and the second higher-order mode can be more reliably set to be equal to or less than about –70 deg. Thus, the first higher-order mode and the second higher-order mode can be more reliably and effectively reduced or prevented.

When the plane orientation of the silicon substrate 2 is (100) and the piezoelectric film 7 is made of a LiTaO₃ film, the cut angle of the piezoelectric film 7 is preferably within a range being equal to or more than about 28° Y and equal to or less than about 48° Y. Thus, similarly to the case illustrated in FIG. 17, the Rayleigh wave can also be reduced or prevented. More specifically, when the phase derived by Equation 6 is equal to or less than about –70 deg and the cut angle of the LiTaO₃ film as the piezoelectric film 7 is within the range being equal to or more than about 28° Y and equal to or less than about 48° Y, the Rayleigh wave and at least the first higher-order mode can be suppressed. When the phase derived by Equation 7 is equal to or more than about –70 deg and the cut angle of the LiTaO₃ film as the piezoelectric film 7 is within the range being equal to or more than about 28° Y and equal to or less than about 48° Y, it is possible to reduce or prevent the Rayleigh wave, the first higher-order mode, and the second higher-order mode.

The example in which the piezoelectric film 7 is made of the LiTaO₃ film has been described above. An example in which the piezoelectric film 7 is made of, for example, a LiNbO₃ film will be described below with reference to FIG. 1.

A second preferred embodiment of the present invention is different from the first preferred embodiment in that the piezoelectric film 7 is made of the LiNbO₃ film. Except for the above point, an acoustic wave device according to the second preferred embodiment has a configuration the same as or similar to that of the acoustic wave device according to the first preferred embodiment.

Here, a phase characteristic of the acoustic wave device having the configuration according to the second preferred embodiment was measured. Design parameters of the acoustic wave device are as follows.

Silicon substrate 2: plane orientation: (111), Si$\psi$ in Euler angles (Si$\varphi$, Si$\theta$, Si$\psi$): about 46°

First high-acoustic-velocity film 3: material: SiN, thickness: about 500 nm

First low-acoustic-velocity film 4: material: SiO₂, thickness: about 100 nm

Second low-acoustic-velocity film 5: material: Ta₂O₅, thickness: about 10 nm Second high-acoustic-velocity film 6: material: SiN, thickness: about 10 nm Piezoelectric film 7: material: 30° Y-cut X-propagation LiNbO₃, thickness: about 400 nm Layer configuration of IDT electrode 8: layer configuration: Ti layer/Al layer/Ti layer from the piezoelectric film 7 side, thicknesses: about 12 nm/about 100 nm/about 4 nm from the piezoelectric film 7 side FIG. 18 is a diagram illustrating the phase characteristic of the acoustic wave device according to the second preferred embodiment.

Figure 18:
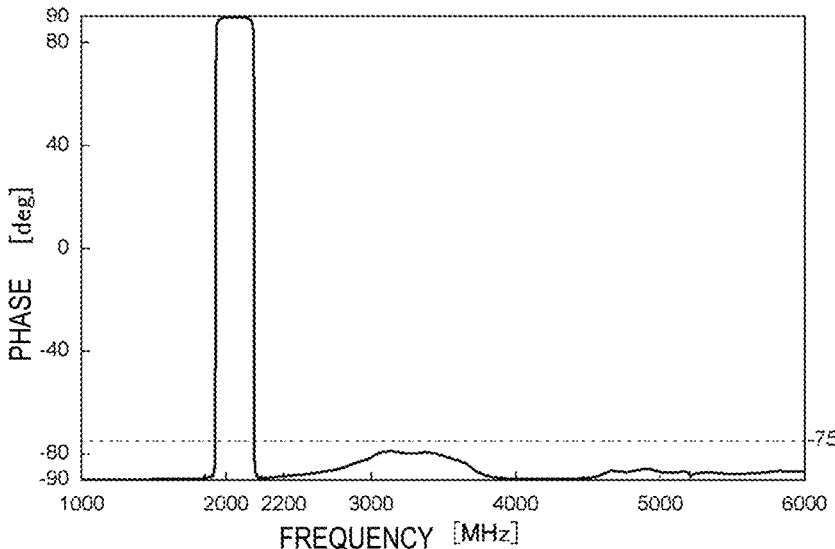
FIG. 18 is a diagram illustrating a phase characteristic of an acoustic wave device according to a second preferred embodiment of the present invention.

As illustrated in FIG. 18, in the second preferred embodiment, it can be seen that the phases of unwanted waves of a higher-order mode and the like are reduced to be less than about –75 deg over a wide band from about 2200 MHz to about 6000 MHz. As described above, also in the second preferred embodiment, as in the first preferred embodiment, it is possible to reduce or prevent unwanted waves of a higher-order mode and the like over a wide band. In addition, as illustrated in FIG. 18, it can be seen that the band of a main mode can be widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a silicon substrate;

25 a first high-acoustic-velocity film on the silicon substrate;

a first low-acoustic-velocity film on the first high-acoustic-velocity film;

a second low-acoustic-velocity film on the first low-acoustic-velocity film;

a second high-acoustic-velocity film on the second low-acoustic-velocity film;

a piezoelectric film on the second high-acoustic-velocity film; and an IDT electrode on the piezoelectric filmi wherein an acoustic velocity of a bulk wave propagating through the first high-acoustic-velocity film and an acoustic velocity of a bulk wave propagating through the second high-acoustic-velocity film are higher than an acoustic velocity of an acoustic wave propagating through the piezoelectric film;

an acoustic velocity of a bulk wave propagating through the first low-acoustic-velocity film and an acoustic velocity of a bulk wave propagating through the second low-acoustic-velocity film are lower than an acoustic velocity of a bulk wave propagating through the piezoelectric film; and a material of the first low-acoustic-velocity film and a material of the second low-acoustic-velocity film are different from each other.

2. The acoustic wave device according to claim 1, wherein a thickness of the first high-acoustic-velocity film is equal to or larger than a thickness of the second high-acoustic-velocity film.

3. The acoustic wave device according to claim 2, wherein a thickness of the first low-acoustic-velocity film is equal to or larger than a thickness of the second low-acoustic-velocity film.

4. The acoustic wave device according to claim 2, wherein a thickness of the first high-acoustic-velocity film is equal to or larger than a thickness of the first low-acoustic-velocity film.

5. The acoustic wave device according to claim 2, wherein the first low-acoustic-velocity film or the second low-acoustic-velocity film is a $SiO_2$ film.

6. The acoustic wave device according to claim 2, wherein the piezoelectric film is a $LiTaO_3$ film or a $LiNbO_3$ film.

7. The acoustic wave device according to claim 2, wherein the piezoelectric film is a $LiTaO_3$ film or a $LiNbO_3$ film.

8. The acoustic wave device according to claim 1, wherein a thickness of the first low-acoustic-velocity film is equal to or larger than a thickness of the second low-acoustic-velocity film.

9. The acoustic wave device according to claim 8, wherein a thickness of the first high-acoustic-velocity film is equal to or larger than a thickness of the first low-acoustic-velocity film.

10. The acoustic wave device according to claim 8, wherein the first low-acoustic-velocity film or the second low-acoustic-velocity film is a $SiO_2$ film.

11. The acoustic wave device according to claim 1, wherein a thickness of the first high-acoustic-velocity film is equal to or larger than a thickness of the first low-acoustic-velocity film.

12. The acoustic wave device according to claim 1, wherein the first low-acoustic-velocity film or the second low-acoustic-velocity film is a $SiO_2$ film.

13. The acoustic wave device according to claim 1, wherein the piezoelectric film is a $LiTaO_3$ film or a $LiNbO_3$ film.

14. The acoustic wave device according to claim 1, wherein

26 a plane orientation of the silicon substrate is (111);

both of the first high-acoustic-velocity film and the second high-acoustic-velocity film are SiN films, the first low-acoustic-velocity film is a $SiO_2$ film, the second low-acoustic-velocity film is a $Ta_2O_5$ film, and the piezoelectric film is a $LiTaO_3$ film; and a wavelength defined by an electrode finger pitch of the IDT electrode is represented as $\lambda$, a thickness of the first high-acoustic-velocity film is defined as t_SiN–1[$\lambda$], a thickness of the second high-acoustic-velocity film is defined as t_SiN–2[$\lambda$], a thickness of the first low-acoustic-velocity film is defined as t_SiO2[$\lambda$], a thickness of the second low-acoustic-velocity film is defined as t_Ta2O5[$\lambda$], a thickness of the piezoelectric film is defined as t_LT[$\lambda$], Euler angles of the piezoelectric film are defined as (LT$\varphi$, LT$\theta$, LT$\psi$), and Euler angles of the silicon substrate are defined as (Si$\varphi$, Si$\theta$, Si$\psi$), the t_SiN–1[$\lambda$], the t_SiN–2[$\lambda$], the t_SiO2[$\lambda$], t_Ta2O5[$\lambda$], the t_LT[$\lambda$], the LT$\theta$, and the Si$\psi$ are thicknesses and angles within a range in which a phase derived from Equation 1 below is equal to or less than about –70 deg:

Phase of spurious wave [deg]

=(−64.7738492449743)+0.799535874292877

*(Si$\psi$−23.2121158601201)+−0.00639116627879308

*(LT$\theta$−131.246414694454)+228.498817195313

*((t_LT[$\lambda$])−0.180166902154725)+−551.916118464126

*((t_SiN–2[$\lambda$])−0.0291537442599814)+1142.73591823813

*((t_Ta2O5[$\lambda$])−0.0421024373013005)+155.359547985879

*((t_SiO2[$\lambda$])−0.121307841752057)+−29.8438742957074

*((t_SiN–1[$\lambda$])−0.263987107029325)+−0.0245466642133507*((Si$\psi$−23.2121158601201)

*(Si$\psi$−23.2121158601201)−540.379061966296)+−0.00862413439802871

*((Si$\psi$−23.2121158601201)*(LT$\theta$−131.246414694454))+0.249067774425361

*((LT$\theta$−131.246414694454)*(LT$\theta$−131.246414694454)−5.81473016925011)+6.93659125135011

*((Si$\psi$−23.2121158601201)*((t_LT[$\lambda$])−0.180166902154725))+10.0784200297745

*((LT$\theta$−131.246414694454)*((t_LT[$\lambda$])−0.180166902154725))+116.492602498829

*(((t_LT[$\lambda$])−0.180166902154725)

*((t_LT[$\lambda$])−0.180166902154725)−0.000346559038760835)+6.96592368109737

*((Si$\psi$−23.2121158601201)*((t_SiN–2[$\lambda$])−0.0291537442599814))+−15.0647392900912*

((LT$\theta$−131.246414694454)*((t_SiN–2[$\lambda$])−0.0291537442599814))+3185.48452246456

*((($t\_LT$[λ])−0.180166902154725)*(($t\_$SiN−2[λ])−
0.0291537442599814))+

6533.48929488482

*((($t\_$SiN−2[λ])−0.0291537442599814)

*(($t\_$SiN−2[λ])−0.0291537442599814)−
0.000458154170897422)+7.78801893149455

*(($Si\psi$−23.2121158601201)*(($t\_$Ta2O5[λ])−
0.0421024373013005))+53.7418010590521

(($LT\theta$−131.246414694454)*(($t\_$Ta2O5[λ])−
0.0421024373013005))+6146.78344504674

*((($t\_LT$[λ])−0.180166902154725)*(($t\_$Ta2O5[λ])−
0.0421024373013005))+−

14578.5920718871

*((($t\_$SiN−2[λ])−0.0291537442599814)*(($t\_$Ta2O5
[λ])−0.0421024373013005))

+28614.912170246

*((($t\_$Ta2O5[λ])−0.0421024373013005)*(($t\_$Ta2O5
[λ])−0.0421024373013005)−

0.000324766882084902)+4.59563385312738

*(($Si\psi$−23.2121158601201)*(($t\_$SiO2[λ])−
0.121307841752057))+1.7616110343796

*(($LT\theta$−131.246414694454)*(($t\_$SiO2[λ])−
0.121307841752057))+1984.12416812403

*((($t\_LT$[λ])−0.180166902154725)*(($t\_$SiO2[λ])−
0.121307841752057))+−202.795292688935

*((($t\_$SiN−2[λ])−0.0291537442599814)*(($t\_$SiO2
[λ])−0.121307841752057))+

5166.03124069752

*((($t\_$Ta2O5[λ])−0.0421024373013005)

*(($t\_$SiO2[λ])−0.121307841752057))+−
346.648683117878*(($t\_$SiO2[λ])−
0.121307841752057)

*(($t\_$SiO2[λ])−0.121307841752057)−
0.0017442053041025)+1.13949852542765

*(($Si\psi$−23.2121158601201)*(($t\_$SiN−1[λ])−
0.263987107029325))+−2.10309868792554

*(($LT\theta$−131.246414694454)*(($t\_$SiN−1[λ])−
0.263987107029325))+342.49568371403*

(($t\_LT$[λ])−0.180166902154725)*(($t\_$SiN−1[λ])−
0.263987107029325))+735.741591105701

*((($t\_$SiN−2[λ])−0.0291537442599814)

*(($t\_$SiN−1[λ])−0.263987107029325))+−
2014.8497951455

*((($t\_$Ta2O5[λ])−0.0421024373013005)*(($t\_$SiN−1
[λ])−0.263987107029325))+

131.054784086532

*((($t\_$SiO2[λ])−0.121307841752057)*(($t\_$SiN−1[λ]
A)−0.263987107029325))+

145.441965448516

*((($t\_$SiN−1[λ])−0.263987107029325)*(($t\_$SiN−1
[λ])−0.263987107029325)−

0.0132035793109828).  Equation 1

15. The acoustic wave device according to claim 1,
wherein a plane orientation of the silicon substrate is (111);

both of the first high-acoustic-velocity film and the second
high-acoustic-velocity film are SiN films, the first low-
acoustic-velocity film is a $SiO_2$ film, the second low-
acoustic-velocity film is a $Ta_2O_5$ film, and the piezo-
electric film is a $LiTaO_3$ film; and a wavelength defined by an electrode finger pitch of the
IDT electrode is represented as λ, a thickness of the first
high-acoustic-velocity film is defined as $t\_$SiN−1[λ], a
thickness of the second high-acoustic-velocity film is
defined as $t\_$SiN−2[λ], a thickness of the first low-
acoustic-velocity film is defined as $t\_$SiO2[λ], a thick-
ness of the second low-acoustic-velocity film is defined
as $t\_$Ta2O5[λ], a thickness of the piezoelectric film is
defined as $t\_LT$[λ], Euler angles of the piezoelectric
film are defined as (LTφ, LTθ, LTψ), and Euler angles
of the silicon substrate are defined as (Siφ, Siθ, Siψ),
the $t\_$SiN−1[λ], the $t\_$SiN−2[λ], the $t\_$SiO2[λ], the
$t\_$Ta2O5[λ], the $t\_LT$[λ], the LTθ, and the Siψ are
thicknesses and angles within a range in which a phase
derived from Equation 2 below is equal to or less than
about −70 deg:

Phase of spurious wave [deg]

=(−49.4236088933048)+0.927126211958592

*(Si$\psi$−23.2121158601201)+0.680023816107774*
($LT\theta$−131.246414694454)+

213.742276430449

*(($t\_LT$[λ])−0.180166902154725)+−
606.139116757393

*(($t\_$SiN−2[λ])−0.0291537442599814)+
692.814216558718

*(($t\_$Ta2O5[λ])−0.0421024373013005)+
195.183979143557

*(($t\_$SiO2[λ])−0.121307841752057)+−
83.0452792358909

*(($t\_$SiN−1[λ])−0.263987107029325)+−
0.0279599052855905*((Si$\psi$−
23.2121158601201)

*(Si$\psi$−23.2121158601201)−540.379061966296)+−
0.0139285317562481

*((Si$\psi$−23.2121158601201)*($LT\theta$−
131.246414694454))+0.293983576167198

*(($LT\theta$−131.246414694454)*($LT\theta$−
131.246414694454)−5.81473016925011)+

9.82906312217327

*((Si$\psi$−23.2121158601201)*($t\_LT$[λ])−
0.180166902154725))+20.4897039882144

*(($LT\theta$−131.246414694454)*(($t\_LT$[λ])−
0.180166902154725))+−1822.1825017687

*((($t\_LT$[λ])−0.180166902154725)

*(($t\_LT$[λ])−0.180166902154725)−
0.000034655903876 0835)+6.57985243569614

*((Siψ−23.2121158601201)*(($t$_SiN−2[λ])−
0.0291537442599814))+−16.3487857288392

*(($LT$θ−131.246414694454)*(($t$_SiN−2[λ])−
0.0291537442599814))+3022.4142953683

*((($t\_LT$[λ])−0.180166902154725)*(($t$_SiN−2[λ])−
0.0291537442599814))+

6106.28960321182

*((($t$_SiN−2[λ])−0.0291537442599814)

*(($t$_SiN−2[λ])−0.0291537442599814)−
0.000458154170897422)+7.61287198883346

*((Siψ−23.2121158601201)*(($t$_Ta2O5[λ])−
0.0421024373013005))+32.0420324509525

*(($LT$θ−131.246414694454)*(($t$_Ta2O5[λ])−
0.0421024373013005))+−5600.23059801591

*((($t\_LT$[λ])−0.180166902154725)*(($t$_Ta2O5[λ])−
0.0421024373013005))+−

12480.4143612638

*((($t$_SiN−2[λ])−0.0291537442599814)

*(($t$_Ta2O5[λ])−0.0421024373013005))+
9462.56388912554

*((($t$_Ta2O5[λ])−0.0421024373013005)

*(($t$_Ta2O5[λ])−0.0421024373013005)−
0.000324766882084902)+4.75660770269025

*((Siψ−23.2121158601201)*(($t$_SiO2[λ])−
0.121307841752057))+3.138310645423

*(($LT$θ−131.246414694454)*(($t$_SiO2[λ])−
0.121307841752057))+782.245112149574

*((($t\_LT$[λ])−0.180166902154725)*(($t$_SiO2[λ])−
0.121307841752057))+−1849.48045553917

*((($t$_SiN−2[λ])−0.0291537442599814)*(($t$_SiO2
[λ])−0.121307841752057))+−

657.25929805289

*((($t$_Ta2O5[λ])−0.0421024373013005)

*(($t$_SiO2[λ])−0.121307841752057))+−
111.444658339511*((($t$_SiO2[λ])−

0.121307841752057)

*(($t$_SiO2[λ])−0.121307841752057)−
0.0017442053041025)+1.37817174855647

*((Siψ−23.2121158601201)*(($t$_SiN−1[λ])−
0.263987107029325))+−1.7087256650039

*(($LT$θ−131.246414694454)*(($t$_SiN−1[λ])−
0.263987107029325))+−396.636995545448

*((($t\_LT$[λ])−0.180166902154725)*(($t$_SiN−1[λ])−
0.263987107029325))+434.882453748749

*((($t$_SiN−2[λ])−0.0291537442599814)

*((($t$_SiN−1[λ])−0.263987107029325))+−
1660.0685005439

*((($t$_Ta2O5[λ])−0.0421024373013005)*(($t$_SiN−1
[λ])−0.263987107029325))+

106.322544176659

*((($t$_SiO2[λ])−0.121307841752057)*(($t$_SiN−1[λ]
A)−0.263987107029325))+

172.372246831877

*((($t$_SiN−1[λ])−0.263987107029325)

*(($t$_SiN−1[λ])−0.263987107029325)−
0.0132035793109828).                    Equation 2

16. The acoustic wave device according to claim 1, wherein a plane orientation of the silicon substrate is (111);

both of the first high-acoustic-velocity film and the second high-acoustic-velocity film are SiN films, the first low-acoustic-velocity film is a $SiO_2$ film, the second low-acoustic-velocity film is a $Ta_2O_5$ film, and the piezo-electric film is a $LiTaO_3$ film; and a wavelength defined by an electrode finger pitch of the IDT electrode is represented as λ, a thickness of the first high-acoustic-velocity film is defined as t_SiN−1[λ], a thickness of the second high-acoustic-velocity film is defined as t_SiN−2[λ], a thickness of the first low-acoustic-velocity film is defined as t_SiO2[λ], a thickness of the second low-acoustic-velocity film is defined as t_Ta2O5[λ], a thickness of the piezoelectric film is defined as t_LT[λ], Euler angles of the piezoelectric film are defined as (LTφ, LTθ, LTψ), and Euler angles of the silicon substrate are defined as (Siφ, Siθ, Siψ), the t_SiN−1[λ], the t_SiN−2[λ], the t_SiO2[λ], the t_Ta2O5[λ], the t_LT[λ], the LTθ, and the Siψ are thicknesses and angles within a range in which a phase derived from Equation 3 below is equal to or larger than about −70 deg:

Phase of spurious wave [deg]

=(−49.446344512493)+0.926632614160644

*(Siψ−23.2121158601201)+0.689805009201412*
($LT$θ−131.246414694454)+

213.186056884304

*(($t\_LT$[λ])−0.180166902154725)+−
605.162234862408

*(($t$_SiN−2[λ])−0.0291537442599814)+
693.090367188157

*(($t$_Ta2O5[λ])−0.0421024373013005)+
194.973246854906

*(($t$_SiO2[λ])−0.121307841752057)+−
82.9891258698242

*(($t$_SiN−1[λ])−0.263987107029325)+−
0.0279312228697236*((Siψ−
23.2121158601201)

*(Siψ−23.2121158601201)−540.379061966296)+−
0.0129242968044351

*((Siψ−23.2121158601201)*($LT$θ−
131.246414694454))+0.285438486600616

*((LTθ−131.246414694454)*(LTθ−
131.246414694454)−5.81473016925011)+

9.7873873803375

*((Siψ−23.2121158601201)*((t_LT[λ])−
0.180166902154725))+20.1009127346539

*((LTθ−131.246414694454)*((t_LT[λ])−
0.180166902154725))+−1845.21253448418

*(((t_LT[λ])−0.180166902154725)

*((t_LT[λ])−0.180166902154725)−
0.000346559038760835)+6.50543677488646

*((Siψ−23.2121158601201)*((t_SiN−2[λ]−
0.0291537442599814))+−17.1312681888354

*((LTθ−131.246414694454)*((t_SiN−2[λ])−
0.0291537442599814))+3096.79723705848

*(((t_LT[λ])−0.180166902154725)*((t_SiN−2[λ])−
0.0291537442599814))+

6184.77577365764

*((((t_SiN−2[λ])−0.0291537442599814)

*((t_SiN−2[λ])−0.0291537442599814)−
0.000458154170897422)+7.56134934721394

*((Siψ−23.2121158601201)*((t_Ta2O5[λ])−
0.0421024373013005))+31.4231915519825

*((LTθ−131.246414694454)*((t_Ta2O5[λ])−
0.0421024373013005))+−5550.14180216517

*(((t_LT[λ])−0.180166902154725)*((t_Ta2O5[λ])−
0.0421024373013005))+−

12378.8114606327

*((((t_SiN−2[λ])−0.0291537442599814)

*((t_Ta2O5[λ])−0.0421024373013005))+
9488.76758932007

*((((t_Ta2O5[λ])−0.0421024373013005)

*((t_Ta2O5[λ])−0.0421024373013005)−
0.000324766882084902)+4.72906984538813

*((Siψ−23.2121158601201)*((t_SiO2[λ])−
0.121307841752057))+2.92834698440594

*((LTθ−131.246414694454)*((t_SiO2[λ])−
0.121307841752057))+795.397518262681

*(((t_LT[λ])−0.180166902154725)*((t_SiO2[λ])−
0.121307841752057))+−1810.07736779714

*((((t_SiN−2[λ])−0.0291537442599814)*((t_SiO2
[λ])−0.121307841752057))+−

633.635642829976

*((((t_Ta2O5[λ])−0.0421024373013005)

*((t_SiO2[λ])−0.121307841752057))+−
115.182409805846*(((t_SiO2[λ])−

0.121307841752057)

*((t_SiO2[λ])−0.121307841752057)−
0.0017442053041025)+1.36398286740725

*((Siψ−23.2121158601201)*((t_SiN−1[λ])−
0.263987107029325))+−1.83297695480188

*((LTθ−131.246414694454)*((t_SiN−1[λ])−
0.263987107029325))+−387.007695236215

*(((t_LT[λ])−0.180166902154725)*((t_SiN−1[λ])−
0.263987107029325))+456.19886315614

*(((t_SiN−2[λ])−0.0291537442599814)

*((t_SiN−1[λ])−0.263987107029325))+−
1644.59679209231

*((((t_Ta2O5[λ])−0.0421024373013005)*((t_SiN−1
[λ])−0.263987107029325))+

113.144234117703

*((((t_SiO2[λ])−0.121307841752057)*((t_SiN−1[λ])−
0.263987107029325))+

173.438761951382

*((((t_SiN−1[λ])−0.263987107029325)*((t_SiN[λ])−
0.263987107029325)−

0.0132035793109828).      Equation 3

17. The acoustic wave device according to claim 1,
wherein a plane orientation of the silicon substrate is (110), both of the first high-acoustic-velocity film and the second
high-acoustic-velocity film are SiN films, the first low-
acoustic-velocity film is a SiO$_2$ film, the second low-
acoustic-velocity film is a Ta$_2$O$_5$ film, and the piezo-
electric film is a LiTaO$_3$ film; and a wavelength defined by an electrode finger pitch of the
IDT electrode is represented as λ, a thickness of the first
high-acoustic-velocity film is defined as t_SiN−1[λ], a
thickness of the second high-acoustic-velocity film is
defined as t_SiN−2[λ], a thickness of the first low-
acoustic-velocity film is defined as t_SiO2[λ], a thick-
ness of the second low-acoustic-velocity film is defined
as t_Ta2O5[λ], a thickness of the piezoelectric film is
defined as t_LT[λ], and Euler angles of the silicon
substrate are defined as (Siφ, Siθ, Siψ), the t_SiN−1[λ],
the t_SiN−2[λ], the t_SiO2[λ], the t_Ta2O5[λ], and the
Siψ are thicknesses and an angle within a range in
which a phase derived from Equation 4 below is equal
to or less than about −70 deg:

Phase of spurious wave [deg]

=(−35.4828976785632)+−565.645491469017

*((t_SiN−2[λ])−0.0350204955532028)+
1015.0372961359

*((t_Ta2O5[λ])−0.0349996340079728)+
144.752343074804

*((t_SiO2[λ])−0.125000914980053)+−
46.0415586945303

*((t_SiN−1[λ])−0.224927716575792)+
1.04686816500004

*((Siψ[deg])−45.0067708523954)+
10682.9573639156*(((t_SiN−2[λ])

−0.0350204955532028)

$*((t\_SiN-2[\lambda])-0.0350204955532028)-$
$\quad 0.000399831223602513)+-13343.4260197881$ $*((((t\_SiN-2[\lambda])-0.0350204955532028)$ $*((t\_Ta2O5[\lambda])-0.0349996340079728))+$
$\quad 14953.0137418577$ $*(((t\_Ta2O5[\lambda])-0.0349996340079728)$ $*((t\_Ta2O5[\lambda])-0.0349996340079728)-$
$\quad 0.000400054898669248)+739.132582722994$ $*((((t\_SiN-2[\lambda])-0.0350204955532028)*((t\_SiO2$
$\quad [\lambda])-0.125000914980053))+$ $4235.91445978005$ $*((((t\_Ta2O5[\lambda])-0.0349996340079728)*((t\_SiO2$
$\quad [\lambda])-0.125000914980053))+$ $209.756610061409$ $*(((t\_SiO2[\lambda])-0.125000914980053)$ $*((t\_SiO2[\lambda])-0.125000914980053)-$
$\quad 0.00250052611269396)+575.276037855751$ $*(((t\_SiN-2[\lambda])-0.0350204955532028)$ $*((t\_SiN-1[\lambda])-0.224927716575792))+-$
$\quad 1900.54066286617$ $*(((t\_Ta2O5[\lambda])-0.0349996340079728)$ $*((t\_SiN-1[\lambda])-0.224927716575792))+-$
$\quad 361.044865348212*(((t\_SiO2[\lambda])-$ $0.125000914980053)$ $*((t\_SiN-1[\lambda])-0.224927716575792))+-$
$\quad 12.6866065936889*(((t\_SiN-1[\lambda])-$ $0.224927716575792)$ $*((t\_SiN-1[\lambda])-0.224927716575792)-$
$\quad 0.0131316741294957)+-15.0286853820076$ $*(((t\_SiN-2[\lambda])-0.0350204955532028)*((Si\psi)-$
$\quad 45.0067708523954))+2.30649064625795$ $*(((t\_Ta2O5[\lambda])-0.0349996340079728)*((Si\psi)-$
$\quad 45.0067708523954))+-2.93242042531494$ $*(((t\_SiO2[\lambda])-0.125000914980053)*((Si\psi)-$
$\quad 45.0067708523954))+0.490207176672433$ $*(((t\_SiN-1[\lambda])-0.224927716575792)*((Si\psi)-$
$\quad 45.0067708523954))+0.0236394426428729$ $*(((Si\psi)-45.0067708523954)*((Si\psi[deg])-$
$\quad 45.0067708523954)-825.841735805153).$    Equation 4

18. The acoustic wave device according to claim 1, wherein a plane orientation of the silicon substrate is (110);

both of the first high-acoustic-velocity film and the second high-acoustic-velocity film are SiN films, the first low-acoustic-velocity film is a $SiO_2$ film, the second low-acoustic-velocity film is a $Ta_2O_5$ film, and the piezoelectric film is a $LiTaO_3$ film; and a wavelength defined by an electrode finger pitch of the IDT electrode is represented as $\lambda$, a thickness of the first high-acoustic-velocity film is defined as t_SiN-1[$\lambda$], a thickness of the second high-acoustic-velocity film is defined as t_SiN-2[$\lambda$], a thickness of the first low-acoustic-velocity film is defined as t_SiO2[$\lambda$], a thickness of the second low-acoustic-velocity film is defined as t_Ta2O5[$\lambda$], a thickness of the piezoelectric film is defined as t_LT[$\lambda$], and Euler angles of the silicon substrate are defined as (Si$\varphi$, Si$\theta$, Si$\psi$), the t_SiN-1[$\lambda$], the t_SiN-2[$\lambda$], the t_SiO2[$\lambda$], the t_Ta2O5[$\lambda$], and the Si$\psi$ are thicknesses and an angle within a range in which a phase derived from Equation 5 below is equal to or less than about −70 deg:

Phase of spurious wave [deg]

$=(-21.043074633666)+-607.846047314191$ $*((t\_SiN-2[\lambda])-0.0350204955532028)+$
$\quad 835.570016969633$ $*((t\_Ta2O5[\lambda])-0.0349996340079728)+$
$\quad 218.780632745606$ $*((t\_SiO2[\lambda])-0.125000914980053)+-$
$\quad 72.9770468417362$ $*((t\_SiN-1[\lambda])-0.224927716575792)+$
$\quad 0.771180072449541$ $*((Si\psi)-45.0067708523954)+9068.29091824635*$
$\quad ((((t\_SiN-2[\lambda])-0.0350204955532028)$ $*((t\_SiN-2[\lambda])-0.0350204955532028)-$
$\quad 0.000399831223602513)+-13159.8293417283$ $*((((t\_SiN-2[\lambda])-0.0350204955532028)$ $*((t\_Ta2O5[\lambda])-0.0349996340079728))+-$
$\quad 12965.3688204255$ $*(((t\_Ta2O5[\lambda])-0.0349996340079728)$ $*((t\_Ta2O5[\lambda])-0.0349996340079728)-$
$\quad 0.000400054898669248)+-902.346601423572$ $*((((t\_SiN-2[\lambda])-0.0350204955532028)*((t\_SiO2$
$\quad [\lambda])-0.125000914980053))+-$ $104.997375301657$ $*((((t\_Ta2O5[\lambda])-0.0349996340079728)*((t\_SiO2$
$\quad [\lambda])-0.125000914980053))+$ $372.567242377661$ $*(((t\_SiO2[\lambda])-0.125000914980053)$ $*((t\_SiO2[\lambda])-0.125000914980053)-$
$\quad 0.00250052611269396)+278.515543336254$ $*(((t\_SiN-2[\lambda])-0.0350204955532028)$ $*((t\_SiN-1[\lambda])-0.224927716575792))+-$
$\quad 2340.42700220237$ $*(((t\_Ta2O5[\lambda])-0.0349996340079728)*((t\_SiN-1$
$\quad [\lambda])-0.224927716575792))+$ $58.3334367716085$ $*(((t\_SiO2[\lambda])-0.125000914980053)*((t\_SiN-1[\lambda])-$
$\quad 0.224927716575792))+$ $21.2408634563023$ $*(((t\_SiN-1[\lambda])-0.224927716575792)$

35

$*((t\_SiN-1[\lambda])-0.224927716575792)-$
    $0.0131316741294957)+-12.3569961396514$ $*(((t\_SiN-2[\lambda])-0.0350204955532028)*((Si\psi)-$
    $45.0067708523954))+6.43899440226174*$ $(((t\_Ta2O5[\lambda])-0.0349996340079728)*((Si\psi)-$
    $45.0067708523954))+-4.05208515458274$ $*(((t\_SiO2[\lambda])-0.125000914980053)*((Si\psi)-$
    $45.0067708523954))+0.851602997008135$ $*(((t\_SiN-1[\lambda])-0.224927716575792)*((Si\psi)-$
    $45.0067708523954))+0.0186630077404119$ $*(((Si\psi)-45.0067708523954)*((Si\psi)-$
    $45.0067708523954)-825.841735805153).$      Equation 5

19. The acoustic wave device according to claim 1, wherein a plane orientation of the silicon substrate is (100);

both of the first high-acoustic-velocity film and the second high-acoustic-velocity film are SiN films, the first low-acoustic-velocity film is a $SiO_2$ film, the second low-acoustic-velocity film is a $Ta_2O_5$ film, and the piezoelectric film is a $LiTaO_3$ film; and a wavelength defined by an electrode finger pitch of the IDT electrode is represented as $\lambda$, a thickness of the first high-acoustic-velocity film is defined as t_SiN-1[$\lambda$], a thickness of the second high-acoustic-velocity film is defined as t_SiN-2[$\lambda$], a thickness of the first low-acoustic-velocity film is defined as t_SiO2[$\lambda$], a thickness of the second low-acoustic-velocity film is defined as t_Ta2O5[$\lambda$], a thickness of the piezoelectric film is defined as t_LT[$\lambda$], and Euler angles of the silicon substrate are defined as (Si$\varphi$, Si$\theta$, Si$\psi$), the t_SiN-1[$\lambda$], the t_SiN-2[$\lambda$], the t_SiO2[$\lambda$], the t_Ta2O5[$\lambda$], and the Si$\psi$ are thicknesses and an angle within a range in which a phase derived from Equation 6 below is equal to or less than about $-70$ deg:

Phase of spurious wave [deg]

$4.23722010895326+-957.681500681962$ $*((t\_SiN-2[\lambda])-0.032371987951807)+$
    $585.864572529366$ $*((t\_Ta2O5[\lambda])-0.0343161281489591)+-$
    $70.8133543143104$ $*((t\_SiO2[\lambda])-0.124755271084337)+-$
    $16.2945641374395$ $*((t\_SiN-1[\lambda])-0.224798055859809)+-$
    $0.502977915315552$ $*(Si\psi-25.0116374589266)+8018.80873572765*$
    $(((t\_SiN-2[\lambda])-0.032371987951807)$ $*((t\_SiN-2[\lambda])-0.032371987951807)-$
    $0.000382941581152127)+-9183.68752253472$ $*(((t\_SiN-2[\lambda])-0.032371987951807)$ $*((t\_Ta2O5[\lambda])-0.0343161281489591))+-$
    $3967.44233744993$ $*(((t\_Ta2O5[\lambda])-0.0343161281489591)$ $*((t\_Ta2O5[\lambda])-0.0343161281489591)-$
    $0.000397417039992328)+-219.740749864906$

36

$*(((t\_SiN-2[\lambda])-0.032371987951807)*((t\_SiO2[\lambda])-$
    $0.124755271084337))+$ $2921.19191101444$ $*(((t\_Ta2O5[\lambda])-0.0343161281489591)*((t\_SiO2$
    $[\lambda])-0.124755271084337))+$ $71.8751971324423$ $*(((t\_SiO2[\lambda])-0.124755271084337)$ $*((t\_SiO2[\lambda])-0.124755271084337)-$
    $0.00251119250370505)+-277.396742510064$ $*(((t\_SiN-2[\lambda])-0.032371987951807)*((t\_SiN-1$
    $[\lambda])-0.224798055859809))+-$ $345.970595680112$ $*(((t\_Ta2O5[\lambda])-0.0343161281489591)$ $*((t\_SiN-1[\lambda])-0.224798055859809))+-$
    $178.32292070599*(((t\_SiO2[\lambda])-$
    $0.124755271084337)$ $*((t\_SiN-1[\lambda])-0.224798055859809))+$
    $76.2377854978502*(((t\_SiN-1[\lambda])-$ $0.224798055859809)$ $*((t\_SiN-1[\lambda])-0.224798055859809)-$
    $0.0131300933916187)+8.30689126408323$ $*(((t\_SiN-2[\lambda])-0.032371987951807)*(Si\psi-$
    $25.0116374589266))+-37.8147686019012$ $*(((t\_Ta2O5[\lambda])-0.0343161281489591)*(Si\psi-$
    $25.0116374589266))+-9.06470966220628$ $*(((t\_SiO2[\lambda])-0.124755271084337)*(Si\psi-$
    $25.0116374589266))+0.152787017528357$ $*(((t\_SiN-1[\lambda])-0.224798055859809)*(Si\psi-$
    $25.0116374589266))+0.0532078049680315$ $*((Si\psi-25.0116374589266)*(Si\psi-$
    $25.0116374589266)-291.798878808268).$      Equation 6

20. The acoustic wave device according to claim 1, wherein a plane orientation of the silicon substrate is (100);

both of the first high-acoustic-velocity film and the second high-acoustic-velocity film are SiN films, the first low-acoustic-velocity film is a $SiO_2$ film, the second low-acoustic-velocity film is a $Ta_2O_5$ film, and the piezoelectric film is a $LiTaO_3$ film; and a wavelength defined by an electrode finger pitch of the IDT electrode is represented as $\lambda$, a thickness of the first high-acoustic-velocity film is defined as t_SiN-1[$\lambda$], a thickness of the second high-acoustic-velocity film is defined as t_SiN-2[$\lambda$], a thickness of the first low-acoustic-velocity film is defined as t_SiO2[$\lambda$], a thickness of the second low-acoustic-velocity film is defined as t_Ta2O5[$\lambda$], a thickness of the piezoelectric film is defined as t_LT[$\lambda$], and Euler angles of the silicon substrate are defined as (Si$\varphi$, Si$\theta$, Si$\psi$), the t_SiN-1[$\lambda$], the t_SiN-2[$\lambda$], the t_SiO2[$\lambda$], the t_Ta2O5[$\lambda$], and the Si$\psi$ are thicknesses and an angle within a range in which a phase derived from Equation 7 below is equal to or less than about $-70$ deg:

Phase of spurious wave [deg]

=7.99511640601924+−921.506922121376

*((*t*_SiN−2[λ])−0.032371987951807)+
586.197692765577

*((*t*_Ta2O5[λ])−0.0343161281489591)+−
19.6299727359544

*((*t*_SiO2[λ])−0.124755271084337)+−
38.2671139134079

*((*t*_SiN−1[λ])−0.224798055859809)+−
0.384667404398566

*(Siψ−25.0116374589266)+7292.21326291196*
((((*t*_SiN−2[λ])−0.032371987951807)

*((*t*_SiN−2[λ])−0.032371987951807)−
0.000382941581152127)+−8838.66675333011

*((((*t*_SiN−2[λ])−0.032371987951807)

*((*t*_Ta2O5[λ])−0.0343161281489591))+−
11789.7264976743

*((((*t*_Ta2O5[λ])−0.0343161281489591)

*((*t*_Ta2O5[λ])−0.0343161281489591)−
0.000397417039992328)+−28.4853757228835

*((((*t*_SiN−2[λ])−0.032371987951807)*((*t*_SiO2[λ])−
0.124755271084337))+

1749.37647871597

*((((*t*_Ta2O5[λ])−0.0343161281489591)*((*t*_SiO2
[λ])−0.124755271084337))+

594.755965541834

*((((*t*_SiO2[λ])−0.124755271084337)

*((*t*_SiO2[λ])−0.124755271084337)−
0.00251119250370505)+−486.955268584051

*((((*t*_SiN−2[λ])−0.032371987951807)*((*t*_SiN−1
[λ])−0.224798055859809))+−

829.859217960196

*((((*t*_Ta2O5[λ])−0.0343161281489591)

*((*t*_SiN−1[λ]A)−0.224798055859809))+−
285.613819272102*((((*t*_SiO2[λ])−

0.124755271084337)

*((*t*_SiN−1[λ])−0.224798055859809))+
118.153648828838*((((*t*_SiN−1[λ])−

0.224798055859809)

*((*t*_SiN−1[λ])−0.224798055859809)−
0.0131300933916187)+9.20315325922817

*((((*t*_SiN−2[λ])−0.032371987951807)*(Siψ−
25.0116374589266))+−39.0707606971878

*((((*t*_Ta2O5[λ])−0.0343161281489591)*(Siψ−
25.0116374589266))+−6.93828445692585

*((((*t*_SiO2[λ])−0.124755271084337)*(Siψ−
25.0116374589266))+−0.327228438235882

*((((*t*_SiN−1[λ])−0.224798055859809)*(Siψ−
25.0116374589266))+0.0471426960942093

*((Siψ−25.0116374589266)*(Siψ−
25.0116374589266)−291.798878808268).     Equation 7

* * * * *